United States Patent
Yamamoto et al.

(10) Patent No.: US 10,490,576 B2
(45) Date of Patent: Nov. 26, 2019

(54) DISPLAY APPARATUS AND ELECTRONIC APPARATUS

(71) Applicant: Sony Corporation, Tokyo (JP)

(72) Inventors: Tetsuro Yamamoto, Kanagawa (JP); Katsuhide Uchino, Kanagawa (JP)

(73) Assignee: Sony Corporation, Tokyo (JP)

( * ) Notice: Subject to any disclaimer, the term of this patent is extended or adjusted under 35 U.S.C. 154(b) by 0 days.

(21) Appl. No.: 16/435,880

(22) Filed: Jun. 10, 2019

(65) Prior Publication Data

US 2019/0305014 A1    Oct. 3, 2019

Related U.S. Application Data

(63) Continuation of application No. 15/486,242, filed on Apr. 12, 2017, now Pat. No. 10,347,668, which is a
(Continued)

(30) Foreign Application Priority Data

Dec. 22, 2008  (JP) .................................. 2008-325072

(51) Int. Cl.
*H01L 51/00* (2006.01)
*H01L 27/12* (2006.01)
(Continued)

(52) U.S. Cl.
CPC .......... *H01L 27/1255* (2013.01); *G09G 3/30* (2013.01); *G09G 3/3225* (2013.01); *G09G 3/3233* (2013.01); *G09G 3/3275* (2013.01); *H01L 27/124* (2013.01); *H01L 27/1222* (2013.01); *H01L 27/3211* (2013.01); *H01L 27/3213* (2013.01); *H01L 27/3253* (2013.01);
(Continued)

(58) Field of Classification Search
None
See application file for complete search history.

(56) References Cited

U.S. PATENT DOCUMENTS

2003/0062826 A1    4/2003   Seo et al.
2003/0116768 A1    6/2003   Ishikawa
(Continued)

FOREIGN PATENT DOCUMENTS

CN          1697006 A       11/2005
JP       2002-132186 A       5/2002
(Continued)

OTHER PUBLICATIONS

Japanese Office Action dated Nov. 2, 2010 for corresponding Japanese Application No. 2008-325072.
(Continued)

*Primary Examiner* — Elmito Breval
(74) *Attorney, Agent, or Firm* — Michael Best & Friedrich LLP

(57) ABSTRACT

Disclosed herein is a display apparatus, including: a plurality of subpixels disposed adjacent each other and forming one pixel which forms a unit for formation of a color image; the plurality of subpixels including a first subpixel which emits light of the shortest wavelength and a second subpixel disposed adjacent the first subpixel; the second subpixel having a light blocking member disposed between the second subpixel and the first subpixel and having a width greater than a channel length or a channel width of a transistor which forms the second subpixel.

12 Claims, 21 Drawing Sheets

Related U.S. Application Data continuation of application No. 14/813,839, filed on Jul. 30, 2015, now Pat. No. 9,653,528, which is a continuation of application No. 14/553,164, filed on Nov. 25, 2014, now Pat. No. 9,129,928, which is a continuation of application No. 14/277,235, filed on May 14, 2014, now Pat. No. 8,922,538, which is a continuation of application No. 14/054,916, filed on Oct. 16, 2013, now Pat. No. 8,896,642, which is a continuation of application No. 13/895,394, filed on May 16, 2013, now Pat. No. 8,593,441, which is a continuation of application No. 12/591,865, filed on Dec. 3, 2009, now Pat. No. 8,451,258.

(51) Int. Cl.
| | | |
|---|---|---|
| *H01L 27/32* | (2006.01) | |
| *H01L 51/52* | (2006.01) | |
| *G09G 3/3233* | (2016.01) | |
| *G09G 3/30* | (2006.01) | |
| *G09G 3/3275* | (2016.01) | |
| *H01L 51/50* | (2006.01) | |
| *G09G 3/3225* | (2016.01) | |
| *G09G 3/3258* | (2016.01) | |
| *G09G 3/3266* | (2016.01) | |

(52) U.S. Cl.
CPC ...... *H01L 27/3262* (2013.01); *H01L 27/3265* (2013.01); *H01L 27/3272* (2013.01); *H01L 27/3276* (2013.01); *H01L 51/5012* (2013.01); *H01L 51/5218* (2013.01); *G09G 3/3258* (2013.01); *G09G 3/3266* (2013.01); *G09G 2300/0426* (2013.01); *G09G 2300/0439* (2013.01); *G09G 2300/0452* (2013.01); *G09G 2300/0819* (2013.01); *G09G 2300/0842* (2013.01); *G09G 2300/0866* (2013.01); *G09G 2310/06* (2013.01); *G09G 2310/08* (2013.01); *G09G 2320/0233* (2013.01); *G09G 2320/046* (2013.01)

(56) References Cited

U.S. PATENT DOCUMENTS

| | | |
|---|---|---|
| 2004/0206960 A1 | 10/2004 | Nishikawa |
| 2005/0136784 A1 | 6/2005 | Seo et al. |
| 2005/0168135 A1 | 8/2005 | Iga |
| 2005/0259052 A1 | 11/2005 | Shin |
| 2008/0238901 A1 | 10/2008 | Taneda et al. |

FOREIGN PATENT DOCUMENTS

| | | |
|---|---|---|
| JP | 2002-141509 A | 5/2002 |
| JP | 2003-084687 A | 3/2003 |
| JP | 2003-332072 A | 11/2003 |
| JP | 2004-127592 A | 4/2004 |
| JP | 2004-214010 A | 7/2004 |
| JP | 2005-181422 A | 7/2005 |
| JP | 2007-157404 A | 6/2007 |
| JP | 2007-310311 A | 11/2007 |
| JP | 2008-159779 A | 7/2008 |
| KR | 20010050803 A | 6/2001 |
| KR | 20060001715 A | 1/2006 |
| KR | 20080032787 A | 4/2008 |
| TW | 1228018 | 12/1991 |
| TW | 200742056 | 12/1995 |

OTHER PUBLICATIONS

Chinese Office Action dated Apr. 30, 2014 for corresponding Chinese Application No. 2012103392087.
Korean Office Action dated Jan. 6, 2015 for corresponding Korean Application No. 10-2009-128879.
Japanese Office Action dated Feb. 15, 2011 for corresponding Japanese Application No. 2008-325072.
Chinese Office Action dated May 9, 2013 for corresponding Chinese Application No. 200910261339.6.
Taiwanese Office Action dated Dec. 26, 2011 for corresponding Taiwanese Application No. 098142909.
U.S. Office Action dated Aug. 31, 2012 for corresponding U.S. Appl. No. 12/591,865.
Korean Office Action dated Jul. 12, 2016 for corresponding Korean Application No. 10-2016-0059479.
Korean Office Action dated Feb. 14, 2017 for corresponding Korean Application No. 10-2016-0174610.

PRIOR TO t=t1 t=t1 t=t2 t=t3 t=t4 t=t5 t=t6 t=t7

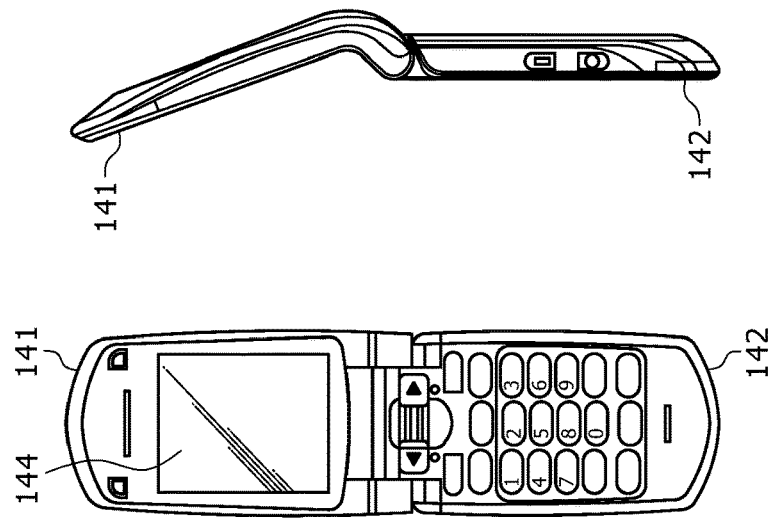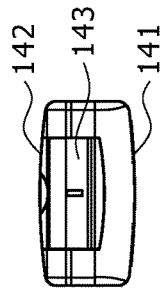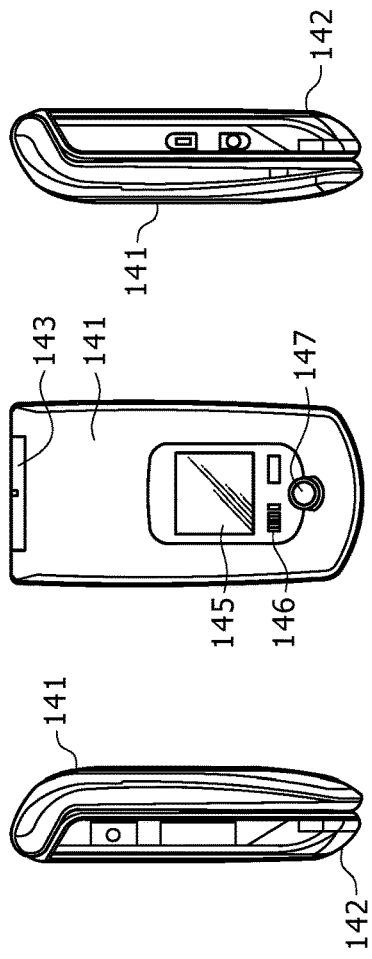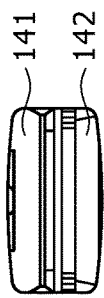

DISPLAY APPARATUS AND ELECTRONIC APPARATUS

CROSS REFERENCES TO RELATED APPLICATIONS

This is a Continuation Application of U.S. patent application Ser. No. 15/486,242, filed Apr. 12, 2017, which is a Continuation Application of U.S. patent application Ser. No. 14/813,839, filed Jul. 30, 2015, now U.S. Pat. No. 9,653,528, issued on May 16, 2017, which is a Continuation Application of U.S. patent application Ser. No. 14/553,164, filed Nov. 25, 2014, now U.S. Pat. No. 9,129,928, issued on Sep. 8, 2015, which is a Continuation Application of U.S. patent application Ser. No. 14/277,235, filed May 14, 2014, now U.S. Pat. No. 8,922,538, issued on Dec. 30, 2014, which is a Continuation Application of U.S. patent application Ser. No. 14/054,916, filed Oct. 16, 2013, now U.S. Pat. No. 8,896,642, issued on Nov. 25, 2014, which is a Continuation Application of U.S. patent application Ser. No. 13/895,394, filed May 16, 2013, now U.S. Pat. No. 8,593,441, issued on Nov. 26, 2013, which is a Continuation Application of U.S. patent application Ser. No. 12/591,865, filed Dec. 3, 2009, now U.S. Pat. No. 8,451,258, issued May 28, 2013, which in turn claims priority from Japanese Application No.: 2008-325072, filed on Dec. 22, 2008, the entire contents of which are incorporated herein by reference.

BACKGROUND OF THE INVENTION

1. Field of the Invention

This invention relates to a display apparatus and an electronic apparatus, and more particularly to a display apparatus of the flat type or flat panel type wherein a plurality of pixels each including an electro-optical element are arranged two-dimensionally in rows and columns, that is, in a matrix, and an electronic apparatus which incorporates the display apparatus.

2. Description of the Related Art

In recent years, in the field of display apparatus which display an image, a flat type display apparatus wherein a plurality of pixels or pixel circuits each including a light emitting element are arranged in rows and columns, has been popularized rapidly. One of such flat type display apparatus uses, as a light emitting element of a pixel, an electro-optical element of the current driven type whose emitted light luminance varies in response to the value of current flowing through the element. As the electro-optical element of the current driven type, an organic EL (Electro Luminescence) element is known which utilizes a phenomenon that an organic thin film emits light when an electric field is applied thereto.

An organic EL display apparatus which uses an organic EL element as an electro-optical element of a pixel has the following characteristics. In particular, the organic EL element has a low-power consumption characteristic because it can be driven by an application voltage equal to or lower than 10 V. Since the organic EL element is a self luminous element, the organic EL display apparatus displays an image of high visibility in comparison with a liquid crystal display apparatus which displays an image by controlling the intensity of light from a light source using liquid crystal for each pixel. Besides, since the organic EL element does not require a light source such as a backlight, it facilitates reduction in weight and thickness of the organic EL display apparatus. Further, since the speed of response is as high as approximately several μsec, an after-image upon dynamic picture display does not appear.

The organic EL display apparatus can adopt a simple or passive matrix type or an active matrix type as a driving method therefor similarly to the liquid crystal display apparatus. However, although the display apparatus of the simple matrix type is simple in structure, it has a drawback in that it is difficult to implement the same as a large-sized high definition display apparatus because the light emitting period of each electro-optical element decreases as the number of scanning lines, that is, the number of pixels, increases.

Therefore, in recent years, development of an active matrix display apparatus wherein the current to flow through an electro-optical element is controlled by an active element provided in a pixel in which the electro-optical element is provided such as, an insulated gate type field effect transistor has been and is being carried out vigorously. As the insulated gate type field effect transistor, a thin film transistor (TFT) is used popularly. The active matrix display apparatus can be easily implemented as a large-sized and high definition display apparatus because the electro-optical element continues to emit light over a period of one frame.

Incidentally, it is generally known that the I-V characteristic, that is, the current-voltage characteristic, of the organic EL element suffers from deterioration as time passes as known as aged deterioration. In a pixel circuit which uses a TFT particularly of the N channel type as a transistor for driving the organic EL element by current (such transistor is hereinafter referred to as driving transistor), if the I-V characteristic of the organic EL element suffers from aged deterioration, then the gate-source voltage Vgs of the driving transistor varies. As a result, the luminance of emitted light of the organic EL element varies. This arises from the fact that the organic EL element is connected to the source electrode side of the driving transistor.

This is described more particularly. The source potential of the driving transistor depends upon the operating point of the driving transistor and the organic EL element. If the I-V characteristic of the organic EL element deteriorates, then the operating point of the driving transistor and the organic EL element varies. Therefore, even if the same voltage is applied to the gate electrode of the driving transistor, the source potential of the driving transistor changes. Consequently, the source-gate voltage Vgs of the driving transistor varies and the value of current flowing to the driving transistor changes. As a result, since also the value of current flowing to the organic EL element varies, the emitted light luminance of the organic EL element varies.

Further, particularly in a pixel circuit which uses a polycrystalline silicon TFT, in addition to the aged deterioration of the I-V characteristic of the organic EL element, a transistor characteristic of the driving transistor varies as time passes or a transistor characteristic differs among different pixels due to a dispersion in the fabrication process. In other words, a transistor characteristic of the driving transistor disperses among individual pixels. The transistor characteristic may be a threshold voltage Vth of the driving transistor, the mobility μ of a semiconductor thin film which forms the channel of the driving transistor (such mobility μ is hereinafter referred to simply as "mobility μ of the driving transistor") or some other characteristic.

Where a transistor characteristic of the driving transistor differs among different pixels, since this gives rise to a dispersion of the value of current flowing to the driving transistor among the pixels, even if the same voltage is applied to the gate electrode of the driving transistor among the pixels, a dispersion appears in the emitted light luminance of the organic EL element among the pixels. As a result, the uniformity of the screen image is damaged.

Therefore, various correction or compensation functions are provided to a pixel circuit in order to keep the emitted light luminance of the organic EL element fixed without being influenced by aged deterioration of the I-V characteristic of the organic EL element or aged deterioration of a transistor characteristic of the driving transistor as disclosed, for example, in Japanese Patent Laid-Open No. 2007-310311.

The correction functions may include a compensation function for a variation of the I-V characteristic variation of the organic EL element, a correction function against the variation of the threshold voltage Vth of the driving transistor, a correction function against the variation of the mobility $\mu$ of the driving transistor and some other function. In the description given below, the correction against the variation of the threshold voltage Vth of the driving transistor is referred to as "threshold value correction," and the correction against the mobility $\mu$ of the driving transistor is referred to as "mobility correction."

Where each pixel circuit is provided with various correction functions in this manner, the emitted light luminance of the organic EL element can be kept fixed without being influenced by aged deterioration of the I-V characteristic of the organic EL element or aged deterioration of a transistor characteristic of the driving transistor. As a result, the display quality of the organic EL display apparatus can be improved.

SUMMARY OF THE INVENTION

Incidentally, if light having high energy is inputted to the channel of a transistor in a pixel in a state wherein a certain fixed voltage is applied to the transistor in the pixel, then the threshold voltage of the transistor shifts to the negative side. In particular, if blue light having a relatively short wavelength and hence having high energy is inputted to the transistor, then the characteristic shift of the transistors becomes very great in comparison with that when no light is inputted as seen from FIG. 26.

As an example, subpixels where subpixel units each including three subpixels for R (red), G (green) and B (blue) are disposed such that the B subpixel is positioned at the center in each unit are considered. The B subpixel is influenced by blue light only when the B subpixel itself emits light.

However, since the R and G subpixels are positioned adjacent the B subpixel, even if they themselves do not emit light, they are influenced by light emitted from the B subpixel positioned adjacent thereto. Where the R and G subpixels are influenced not only by light emitted from them themselves but also by light emitted from the adjacent subpixel, it is very difficult to compensate for a current variation in a correction process or a like process.

Although the foregoing description is given in regard to a B subpixel in color coating of RGB, this similarly applies also to a subpixel which emits light of the shortest wavelength and hence of the highest energy in any other color coating.

Accordingly, it is demanded to provide a display apparatus and an electronic apparatus wherein it is possible to suppress a characteristic shift of a transistor of a subpixel which appears when light having high energy is inputted to the channel of the transistor.

According to an embodiment of the present invention, there is provided a display apparatus including a plurality of subpixels disposed adjacent each other and forming one pixel which forms a unit for formation of a color image, the plurality of subpixels including a first subpixel which emits light of the shortest wavelength and a second subpixel disposed adjacent the first subpixel, the second subpixel having a light blocking member disposed between the second subpixel and the first subpixel and having a width greater than a channel length or a channel width of a transistor which forms the second subpixel.

Emitted light having a relatively short wavelength has high energy. In the display apparatus, if light having the shortest wavelength and having high intensity is inputted from the first subpixel to the channel of the transistor in the second subpixel which is positioned adjacent the first subpixel and to which a voltage is applied, then a characteristic shift occurs with the transistor. Here, since the second subpixel has the light blocking member disposed between the second subpixel and the first subpixel, the light blocking member acts to block the light emitted from the first subpixel from entering the second subpixel. Consequently, the characteristic shift of the transistor which is caused by incidence of light having high energy to the channel of the transistor can be suppressed.

With the display apparatus, since a characteristic shift of the transistor which is caused by incidence of light having high energy to the channel of the transistor can be suppressed, decrease of current to flow to an electro-optical element and occurrence of a fault in picture quality such as stripes and luminance unevenness can be suppressed.

The above and other features and advantages of the embodiment of the present invention will become apparent from the following description and the appended claims, taken in conjunction with the accompanying drawings in which like parts or elements denoted by like reference symbols.

BRIEF DESCRIPTION OF THE DRAWINGS

FIGS. 25A and 25B are a front elevational view and a side elevational view showing an appearance of a portable telephone set to which an embodiment of the present invention is applied in an unfolded state and FIGS. 25C, 25D, 25E, 25F and 25G are a front elevational view, a left side elevational view, a right side elevational view, a top plan view and a bottom plan view of the portable telephone set in a folded state, respectively.

DETAILED DESCRIPTION OF THE PREFERRED EMBODIMENT

In the following, a preferred embodiment of the present invention is described in detail with reference to the accompanying drawings. It is to be noted that the description is given in the following order:

1. Embodiment (light blocking layout of the pixels)
1-1. Working example 1
1-2. Working example 2
2. Modifications
3. Applications (electronic apparatus)

1. Embodiment

[System Configuration]

Figure 1:
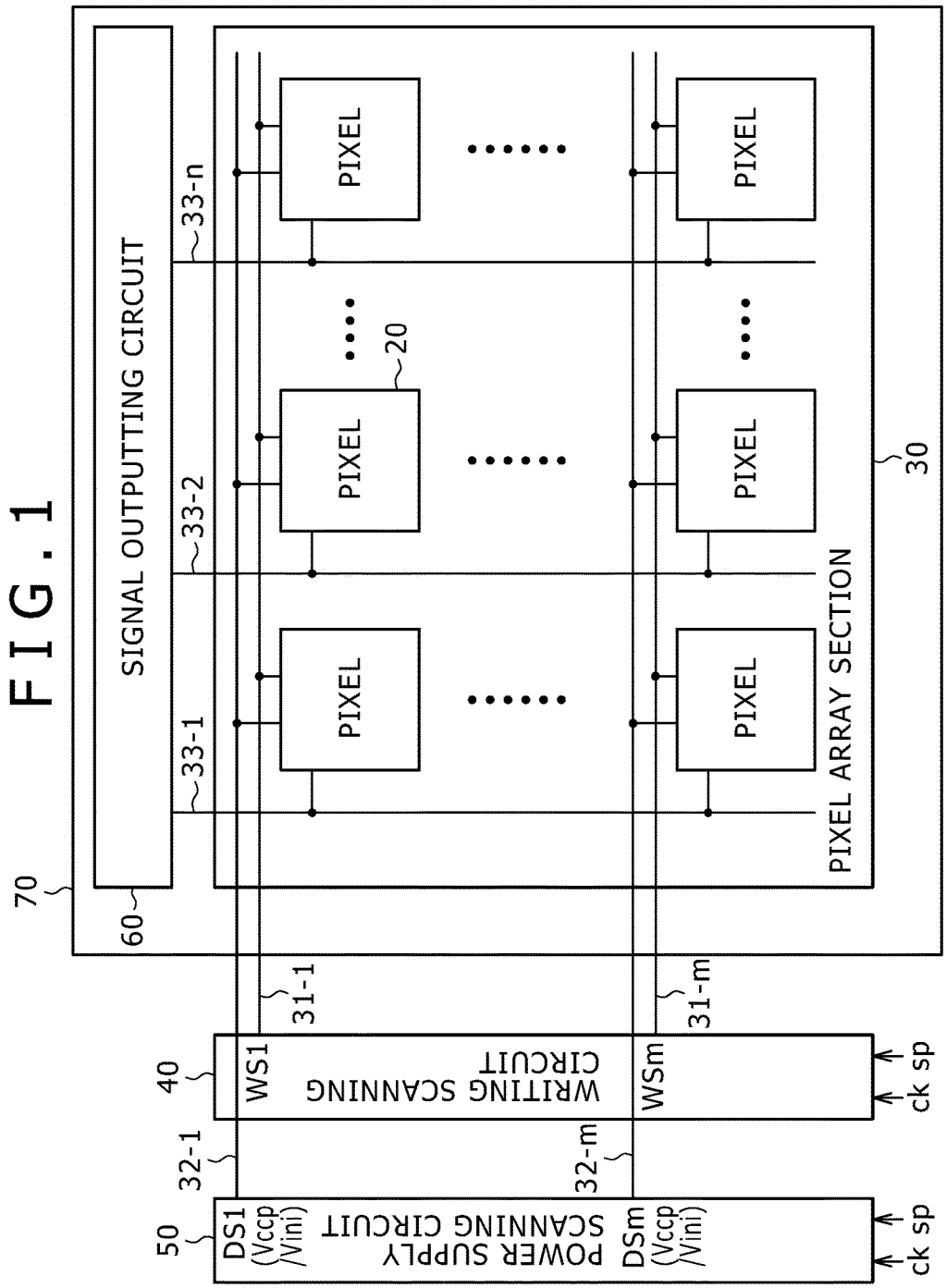
FIG. 1 is a block diagram showing a general system configuration of an organic EL display apparatus to which an embodiment of the present invention is applied.

FIG. 1 is a block diagram showing a general system configuration of an active matrix display apparatus to which an embodiment of the present invention is applied. Here, it is assumed that the active matrix display apparatus described is an active matrix organic EL display apparatus wherein an organic EL element which is an electro-optical element of the current driven type whose emitted light luminance varies in response the value of current flowing through the element is used as a light emitting element of a pixel or pixel circuit.

Referring to FIG. 1, the organic EL display apparatus 10 shown includes a plurality of pixels 20 each including a light emitting element, a pixel array section 30 in which the pixels 20 are arranged two-dimensionally in rows and columns, that is, in a matrix, and driving sections disposed around the pixel array section 30. The driving sections drive the pixels 20 of the pixel array section 30 to emit light.

The driving sections for the pixels 20 include a scanning driving system including a writing scanning circuit 40 and a power supply scanning circuit 50 and a signal supplying system including a signal outputting circuit 60. In the organic EL display apparatus 10 of the present embodiment, the signal outputting circuit 60 is provided on a display panel 70 on which the pixel array section 30 is formed while the writing scanning circuit 40 and the power supply scanning circuit 50 which form the scanning driving system are provided externally of the display panel or substrate 70.

Here, if the organic EL display apparatus 10 is ready for white/black display, then one pixel which makes a unit for forming a monochromatic image corresponds to a pixel 20. On the other hand, where the organic EL display apparatus 10 is ready for color display, one pixel which makes a unit for forming a color image is formed from a plurality of subpixels, each of which corresponds to a pixel 20. More particularly, in a display apparatus for color display, one pixel is composed of three subpixels including a subpixel for emitting red light (R), another subpixel for emitting green light (G) and a further subpixel for emitting blue right (B).

However, one pixel is not necessarily formed from a combination of subpixels of the three primary colors of R, G and B but may be formed from one or a plurality of subpixels of a color or different colors in addition to the subpixels of the three primary colors. In particular, for example, a subpixel for emitting white light (W) may be added to form one pixel in order to raise the luminance, or at least one subpixel for emitting light of a complementary color may be added to form one pixel in order to expand the color reproduction range.

The pixels 20 are arrayed in m rows and n columns in the pixel array section 30, and scanning lines 31-1 to 31-m and power supply lines 32-1 to 32-m are wired for the individual pixel rows along the direction of a row, that is, along the direction along which the pixels in a pixel row are arranged. Further, signal lines 33-1 to 33-n are wired for the individual pixel columns along the direction of a column, that is, along the direction along which the pixels in a pixel column are arranged.

The scanning lines 31-1 to 31-m are individually connected to output terminals of the writing scanning circuit 40 for the corresponding rows. The power supply lines 32-1 to 32-m are individually connected to output terminals of the power supply scanning circuit 50 for the corresponding rows. The signal lines 33-1 to 33-n are individually connected to output terminals of the signal outputting circuit 60 for the corresponding columns.

The pixel array section 30 is normally formed on a transparent insulating substrate such as a glass substrate. Consequently, the organic EL display apparatus 10 has a flat panel structure. A driving circuit for each of the pixels 20 of the pixel array section 30 can be formed using an amorphous silicon TFT (Thin Film Transistor) or a low temperature polycrystalline silicon TFT. Where a low temperature polycrystalline silicon TFT is used, also the writing scanning circuit 40 and power supply scanning circuit 50 can be mounted on the display panel or substrate 70.

The writing scanning circuit 40 is formed from a shift register which successively shifts a start pulse sp in synchronism with a clock pulse ck or from a like element. Upon writing of an image signal into the pixels 20 in the pixel array section 30, the writing scanning circuit 40 successively supplies a writing scanning signal WS (WS1 to WSm) to the scanning lines 31-1 to 31-$m$ to successively scan (line sequential scanning) the pixels 20 of the pixel array section 30 in a unit of a row.

The power supply scanning circuit 50 is formed from a shift register which successively shifts the start pulse sp in synchronism with the clock pulse ck or from a like element. The power supply scanning circuit 50 supplies a power supply potential DS (DS1 to DSm), which changes over between a first power supply potential Vccp and a second power supply potential Vini which is lower than the first power supply potential Vccp, to the power supply lines 32-1 to 32-$m$ in synchronism with line sequential scanning by the writing scanning circuit 40. By the changeover of the power supply potential DS between the first power supply potential Vccp and the second power supply potential Vini, control of light emission/no-light emission of the pixels 20 is carried out.

The signal outputting circuit 60 selects one of a signal voltage Vsig of an image signal supplied from a signal supply line not shown and representative of luminance information and a reference potential Vofs and outputs the selected voltage. The reference potential Vofs selectively outputted from the signal outputting circuit 60 is used as a reference for the signal voltage Vsig of the image signal and corresponds, for example, to the black level of the image signal.

The signal outputting circuit 60 may be formed using a well-known circuit configuration, for example, of a time-division driving system. The time-division driving system is also called selector system and allocates a plurality of signal lines in a unit or group to one of output terminals of a driver (not shown) which serves as a signal supplying source. Then, the plural signal lines are successively selected time-divisionally, and image signals outputted in a time series for the individual output terminals of the driver are distributed and supplied time divisionally to the selected signal lines to drive the signal lines.

In the case of a display apparatus ready for color display as an example, image signals of R, G and B are inputted in a time series to the signal outputting circuit 60 within one horizontal period from the driver in a unit of three pixels of R, G and B which are positioned adjacent. The signal outputting circuit 60 is formed from selectors or selection switches provided corresponding to the three pixel columns of R, G and B such that the selectors successively carry out a turning on operation time-divisionally to write image signals of R, G and B time-divisionally into corresponding signal lines.

While one unit here includes three pixel columns or signal lines of R, G and B, the unit is not limited to this. In particular, since the time-division driving method or selector method is adopted, where the time-division number is represented by x which is an integer equal to or greater than 2, the number of outputs of the driver and the number of lines between the driver and the signal outputting circuit 60 and hence between the driver and the display panel 70 can be reduced to 1/x the number of signal lines.

The signal voltage Vsig or the reference potential Vofs selectively outputted from the signal outputting circuit 60 is written into the pixels 20 of the pixel array section 30 in a unit of a row through the signal lines 33-1 to 33-$n$. In other words, the signal outputting circuit 60 exhibits a line sequential writing driving form wherein the signal voltage Vsig is written in a unit of a row or line.

(Pixel Circuit)

Figure 2:
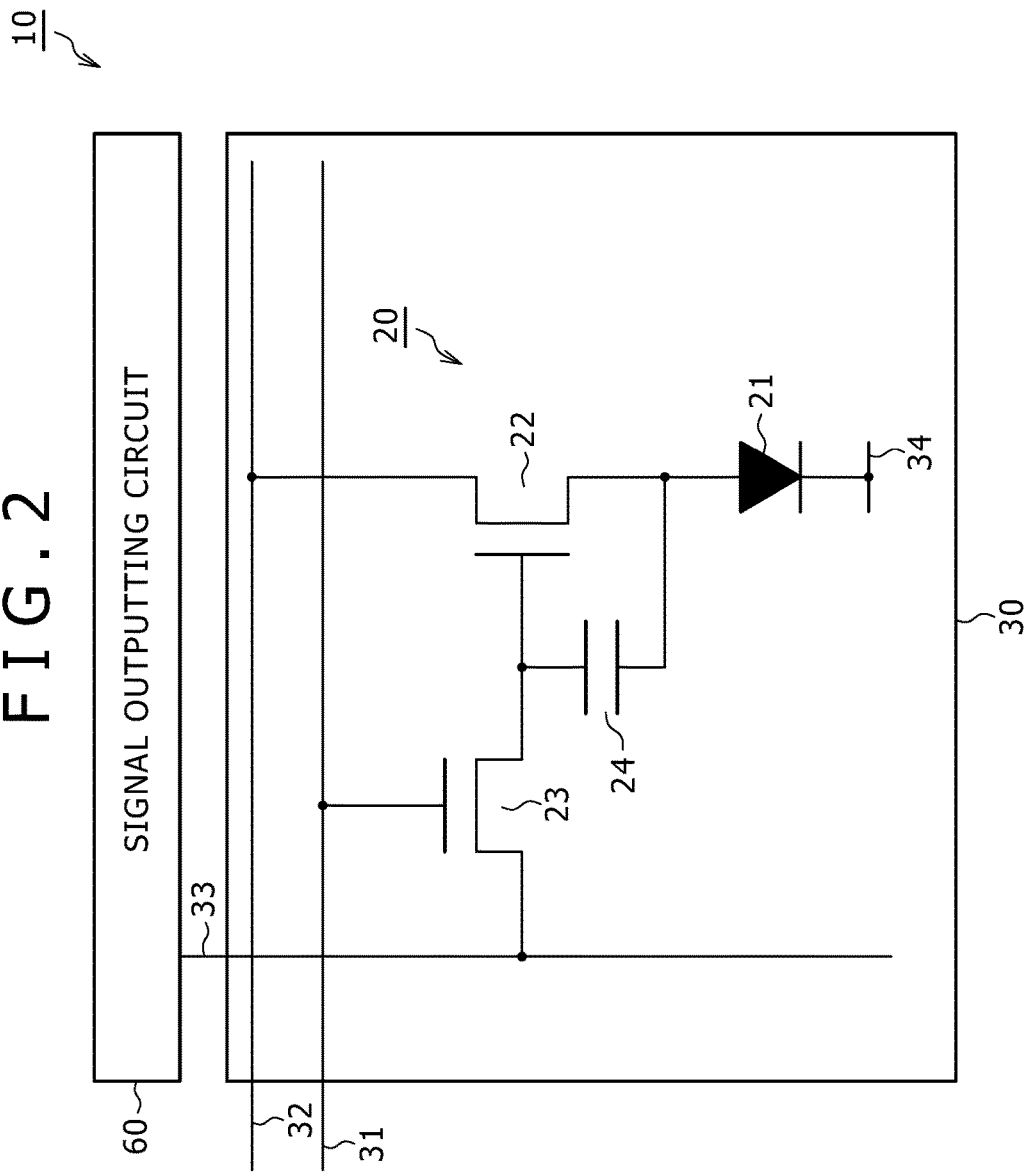
FIG. 2 is a block circuit diagram showing a circuit configuration of a pixel.

FIG. 2 shows a particular circuit configuration of a pixel or pixel circuit 20 used in the organic EL display apparatus 10 according to the present embodiment.

Referring to FIG. 2, the pixel 20 includes an electro-optical element of the current driven type whose emitted light luminance varies in response to the value of current flowing therethrough such as, an organic EL element 21, and a driving circuit for driving the organic EL element 21. The organic EL element 21 is connected at the cathode electrode thereof to a common power supply line 34 which is wired commonly to all pixels 20.

The driving circuit for driving the organic EL element 21 includes a driving transistor 22, a writing transistor or sampling transistor 23, and a storage capacitor 24. Here, an N-channel TFT is used for the driving transistor 22 and the writing transistor 23. However, this combination of the conduction types of the driving transistor 22 and the writing transistor 23 is a mere example, and the combination of such conduction types is not limited to this specific combination.

It is to be noted that, where an N-channel TFT is used for the driving transistor 22 and the writing transistor 23, an amorphous silicon (a-Si) process can be used for the fabrication of them. Where the a-Si process is used, reduction of the cost of a substrate on which the TFTs are to be produced and reduction of the cost of the organic EL display apparatus 10 can be anticipated. Further, if the driving transistor 22 and the writing transistor 23 are formed in a combination of the same conduction type, then since the transistors 22 and 23 can be produced by the same process, this can contribute to reduction of the cost.

The driving transistor 22 is connected at a first electrode thereof, that is, at the source/drain electrode thereof, to the anode electrode of the organic EL element 21 and at a second electrode thereof, that is, at the drain/source electrode thereof, to a power supply line 32 (32-1 to 32-$m$).

The writing transistor 23 is connected at the gate electrode thereof to a scanning line 31 (31-1 to 31-$m$). Further, the writing transistor 23 is connected at a first electrode thereof, that is, at the source/drain electrode thereof, to a signal line 33 (33-1 to 33-$n$) and at a second electrode thereof, that is, at the drain/source electrode thereof, to the gate electrode of the driving transistor 22.

In the driving transistor 22 and the writing transistor 23, the first electrode is a metal line electrically connected to the source/drain region, and the second electrode is a metal line electrically connected to the drain/source region. Further, depending upon the relationship of the potential between the first electrode and the second electrode, the first electrode may be the source electrode or the drain electrode, and the second electrode may be the drain electrode or the source electrode.

The storage capacitor 24 is connected at an electrode thereof to the gate electrode of the driving transistor 22 and at the other electrode thereof to the second electrode of the driving transistor 22 and the anode electrode of the organic EL element 21.

It is to be noted that the circuit configuration of the driving circuit for the organic EL element 21 is not limited to that which includes the two transistors of the driving transistor 22 and the writing transistor 23 and the one capacitor element of the storage capacitor 24. For example, it is possible to adopt another circuit configuration wherein an auxiliary capacitor connected at an electrode thereof to the anode electrode of the organic EL element 21 and at the other electrode thereof to a fixed potential is provided as occasion demands in order to make up for shortage of the capacitance of the organic EL element 21.

In the pixel 20 having the configuration described above, the writing transistor 23 is placed into a conducting state in response to a High-active writing scanning signal WS applied to the gate electrode of the writing transistor 23 through the scanning line 31 from the writing scanning circuit 40. Consequently, the writing transistor 23 samples the signal voltage Vsig of an image signal representative of luminance information or the reference potential Vofs supplied from the signal outputting circuit 60 through the signal line 33 and writes the sampled potential into the pixel 20. The thus written signal voltage Vsig or reference potential Vofs is applied to the gate electrode of the driving transistor 22 and stored into the storage capacitor 24.

The driving transistor 22 operates, when the power supply potential DS of the power supply line 32 (32-1 to 32-m) is the first power supply potential Vccp, in a saturation region while the first electrode serves as the drain electrode and the second electrode serves as the source electrode. Consequently, the driving transistor 22 receives supply of current from the power supply line 32 and drives the organic EL element 21 by current driving to emit light. More particularly, the driving transistor 22 operates in a saturation region thereof to supply driving current of a current value corresponding to the voltage value of the signal voltage Vsig stored in the storage capacitor 24 to the organic EL element 21 to drive the organic EL element 21 with the current so as to emit light.

Further, when the power supply potential DS changes over from the first power supply potential Vccp to the second power supply potential Vini, the first electrode of the driving transistor 22 serves as the source electrode while the second electrode of the driving transistor 22 serves as the drain electrode, and the driving transistor 22 operates as a switching transistor. Consequently, the driving transistor 22 stops supply of driving current to the organic EL element 21 by switching operation thereof to place the organic EL element 21 into a no-light emitting state. Thus, the driving transistor 22 has a function also as a transistor for controlling light emission/no-light mission of the organic EL element 21.

The switching operation of the driving transistor 22 provides a period within which the organic EL element 21 is in a no-light emitting state, that is, a no-light emitting period and controls the ratio between the light emitting period and the no-light emitting period of the organic EL element 21, that is, the duty of the organic EL element 21. By this duty control, after-image blurring caused by emission of light from a pixel 20 over a one-frame period can be reduced, and consequently, the picture quality particularly of a dynamic picture can be enhanced.

The first power supply potential Vccp from between the first and second power supply potentials Vccp and Vini selectively supplied from the power supply scanning circuit 50 through the power supply line 32 is a power supply potential for supplying driving current for driving the organic EL element 21 to emit light to the organic EL element 21. Meanwhile, the second power supply potential Vini is used to apply a reverse bias to the organic EL element 21. This second power supply potential Vini is set to a potential lower than the reference potential Vofs for the signal voltage, for example, to a potential lower than Vofs−Vth where Vth is a threshold voltage of the driving transistor 22, preferably to a potential sufficiently lower than Vofs−Vth.

(Pixel Structure)

Figure 3:
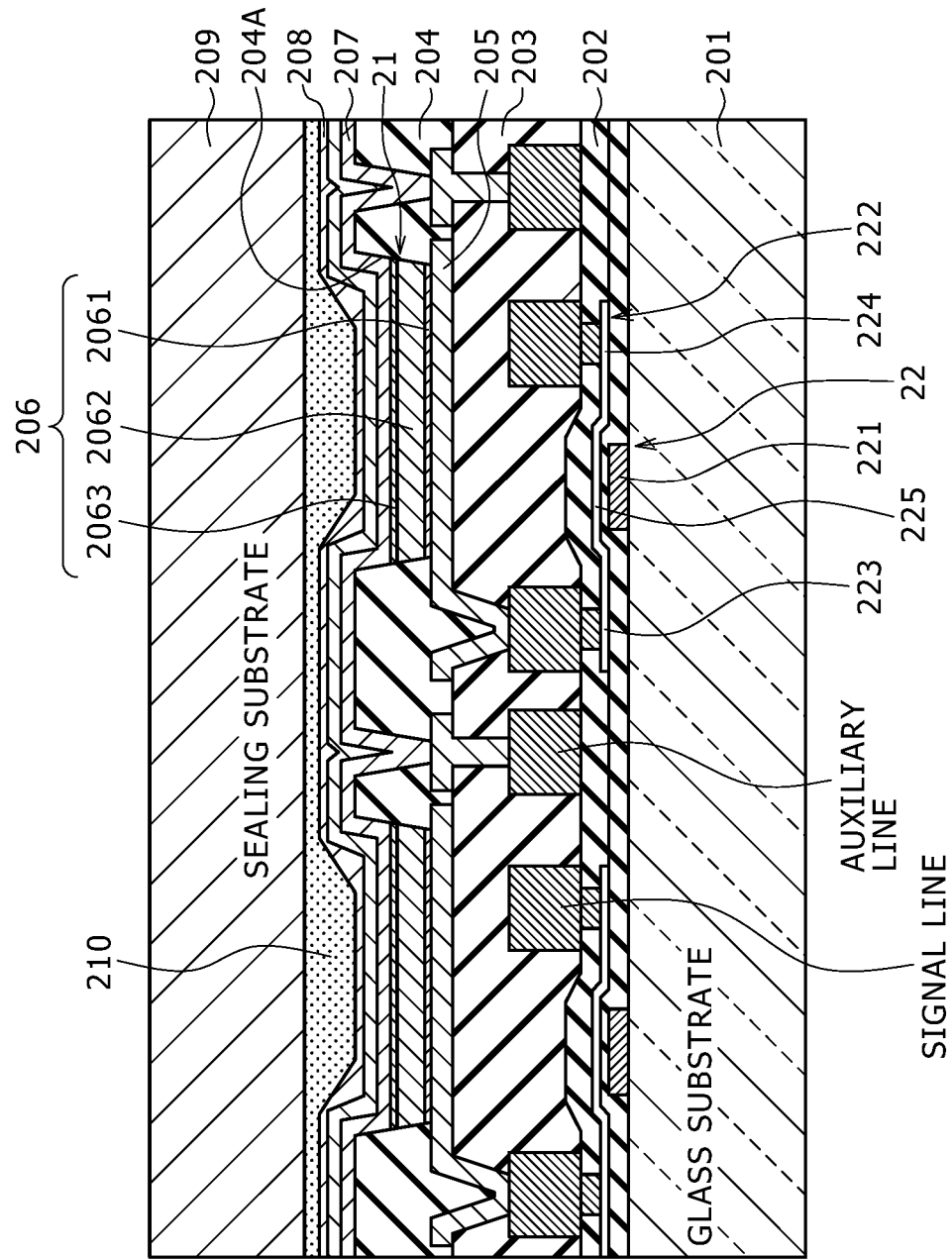
FIG. 3 is a sectional view showing an example of a sectional structure of a pixel.

FIG. 3 shows a sectional structure of a pixel 20. Referring to FIG. 3, the pixel 20 is formed on a glass substrate 201 on which a driving circuit including a driving transistor 22 and so forth is formed. The pixel 20 is configured such that an insulating film 202, an insulating flattening film 203 and a window insulating film 204 are formed in order on the glass substrate 201 and an organic EL element 21 is provided at a recessed portion 204A of the window insulating film 204. Here, from among the components of the driving circuit, only the driving transistor 22 is shown while the other components are omitted.

The organic EL element 21 is formed from an anode electrode 205 made of metal or the like, an organic layer 206 formed on the anode electrode 205, and a cathode electrode 207 formed from a transparent conductive film or the like formed commonly to all pixels on the organic layer 206. The anode electrode 205 is formed on the bottom of the recessed portion 204A of the window insulating film 204.

In the organic EL element 21, the organic layer 206 is formed from a hole transport layer/hole injection layer 2061, a light emitting layer 2062, an electron transport layer 2063 and an electron injection layer (not shown) deposited in order on the anode electrode 205. If current flows from the driving transistor 22 to the organic layer 206 through the anode electrode 205 under the current driving by the driving transistor 22 shown in FIG. 2, then electrons and holes are recombined in the light emitting layer 2062 in the organic layer 206, whereupon light is emitted from the light emitting layer 2062.

The driving transistor 22 includes a gate electrode 221, a channel formation region 225 provided at a portion of the semiconductor layer 222 opposing to the gate electrode 221 and source/drain regions 223 and 224 provided on the opposite sides of the channel formation region 225 on a semiconductor layer 222. The source/drain region 223 is electrically connected to the anode electrode 205 of the organic EL element 21 through a contact hole.

Then, the organic EL element 21 is formed in a unit of a pixel on the glass substrate 201, on which the driving circuit including the driving transistor 22 is formed, through the insulating film 202, insulating flattening film 203 and window insulating film 204. Then, a sealing substrate 209 is adhered through a passivation film 208 by a bonding agent 210, whereupon the organic EL element 21 is sealed with the sealing substrate 209 to form the display panel 70.

[Circuit Operation of the Organic EL Display Apparatus]

Now, circuit operation of the organic EL display apparatus 10 wherein the pixels 20 having the configuration described above are arranged two-dimensionally is described with reference to FIGS. 5A to 5D and 6A to 6D in addition to FIG. 4.

It is to be noted that, in FIGS. 5A to 5D and 6A to 6D, the writing transistor 23 is represented by a symbol of a switch for simplified illustration. Further, as well known in the art, the organic EL element 21 has equivalent capacitance or parasitic capacitance Cel. Accordingly, also the equivalent capacitance Cel is shown in FIGS. 5A to 5D and 6A to 6D.

Figure 4:
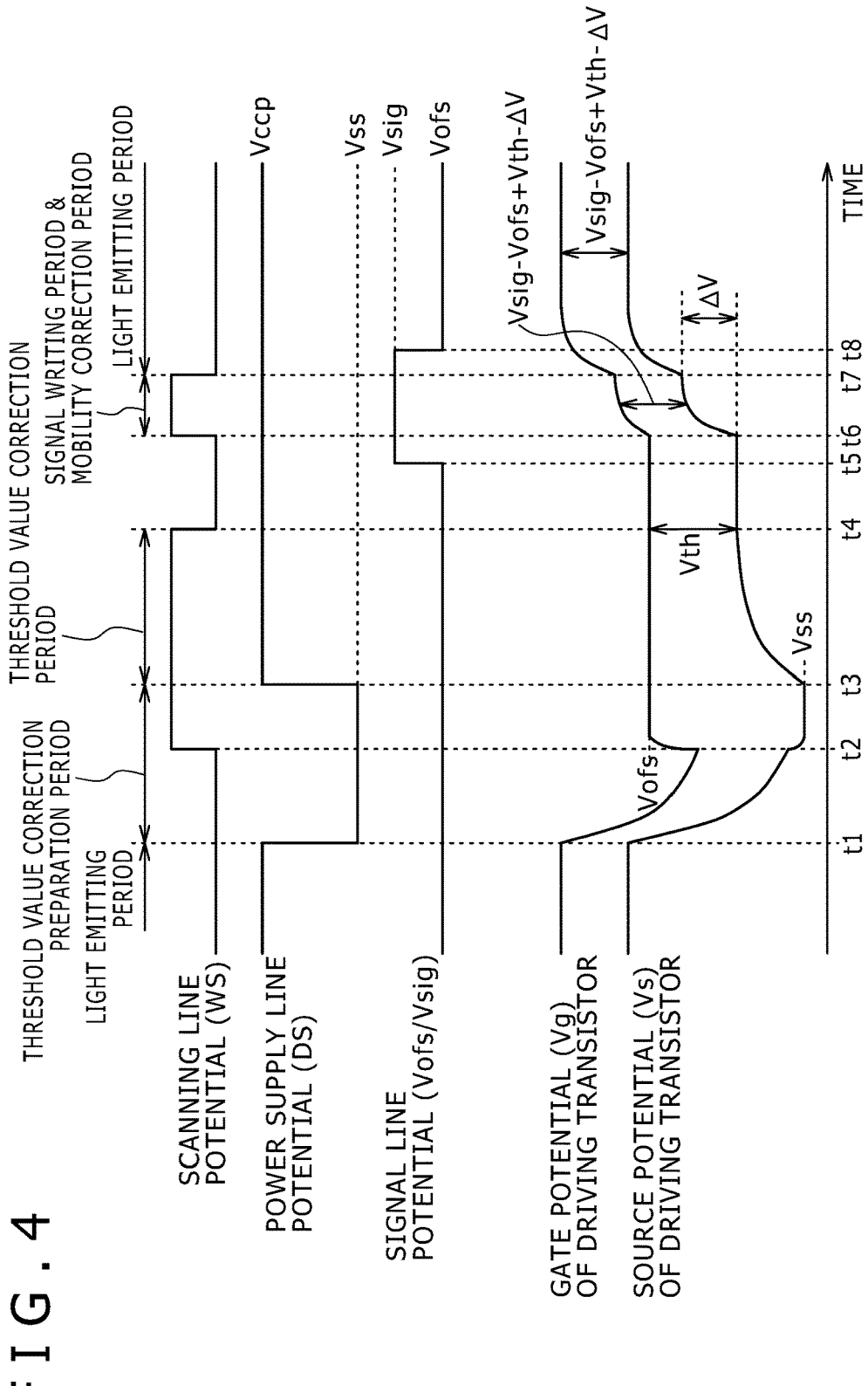
FIG. 4 is a timing waveform diagram illustrating circuit operation of the organic EL display apparatus of FIG. 1.

In FIG. 4, a variation of the potential of the writing scanning signal WS of a scanning line 31 (31-1 to 31-*m*), a variation of the potential of the power supply potential DS of a power supply line 32 (32-1 to 32-*m*) and variations of the gate potential Vg and the source potential Vs of the driving transistor 22.

<<Light Emitting Period within the Preceding Frame>>

In FIG. 4, prior to time t1, a light emitting period of the organic EL element 21 within the preceding frame or field is provided. Within the light emitting period of the preceding frame, the power supply potential DS of the power supply line 32 has a first power supply potential (hereinafter referred to as "high potential") Vccp and the writing transistor 23 is in a non-conductive state.

The driving transistor 22 is designed such that, at this time, it operates in a saturation region. Consequently, driving current or drain-source current Ids corresponding to the gate-source voltage Vgs of the driving transistor 22 is supplied from the power supply line 32 to the organic EL element 21 through the driving transistor 22. Consequently, the organic EL element 21 emits light with a luminance corresponding to the current value of the driving current Ids.

<<Threshold Value Correction Preparation Period>>

At time t1, a new frame of line sequential scanning, that is, a current frame, is entered. Then, the potential DS of the power supply line 32 changes over from the high potential Vccp to a second power supply voltage (hereinafter referred to as "low potential") Vini, which is sufficiently lower than Vofs−Vth, with respect to the reference potential Vofs of the signal line 33 as seen from FIG. 5B.

Here, the threshold voltage of the organic EL element 21 is represented by Vthel, and the potential of the common power supply line 34, that is, the cathode potential, is represented by Vcath. At this time, if the low potential Vini satisfies Vini<Vthel+Vcath, then since the source potential Vs of the driving transistor 22 becomes substantially equal to the low potential Vini, the organic EL element 21 is placed into a reversely biased state and stops the emission of light.

Figure 5A:
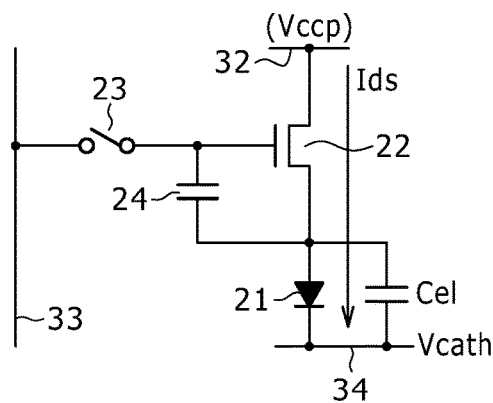
FIGS. 5A to 5D and 6A to 6D are circuit diagrams illustrating circuit operations of the organic EL display apparatus of FIG. 1.
Figure 5B:
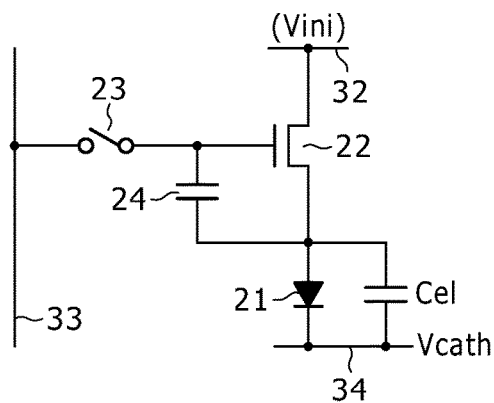
Figure 5C:
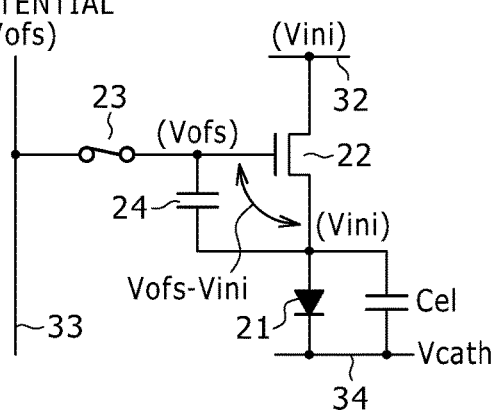

Then, when the potential WS of the scanning line 31 changes from the low potential side to the high potential side at time t2, the writing transistor 23 is placed into a conducting state as seen from FIG. 5C. At this time, since the reference potential Vofs is supplied from the signal outputting circuit 60 to the signal line 33, the gate potential Vg of the driving transistor 22 becomes equal to the reference potential Vofs. Meanwhile, the source potential Vs of the driving transistor 22 is equal to the low potential Vini sufficiently lower than the reference potential Vofs.

At this time, the gate-source voltage Vgs of the driving transistor 22 is Vofs−Vini. Here, if Vofs−Vini is not sufficiently greater than the threshold potential Vth of the driving transistor 22, then a threshold value correction process hereinafter described cannot be carried out, and therefore, it is necessary to establish the potential relationship of Vofs−Vini>Vth.

In this manner, the process of fixing or finalizing the gate potential Vg of the driving transistor 22 to the reference potential Vofs and the source potential Vs of the driving transistor 22 to the low potential Vini to initialize them is a process of preparation (threshold value correction preparation) before a threshold value correction process hereinafter described is carried out. Accordingly, the reference potential Vofs and the low potential Vini become initialization potentials for the gate potential Vg and the source potential Vs of the driving transistor 22, respectively.

<<Threshold Value Correction Period>>

Figure 5D:
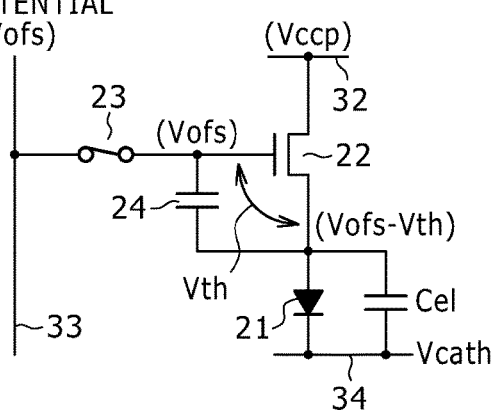

Then, if the potential DS of the power supply line 32 changes over from the low potential Vini to the high potential Vccp at time t3 as seen in FIG. 5D, then a threshold value correction process is started in a state wherein the gate potential Vg of the driving transistor 22 is maintained. In particular, the source potential Vs of the driving transistor 22 begins to rise toward the potential of the difference of the threshold potential Vth of the driving transistor 22 from the gate potential Vg.

Here, the process of varying the source potential Vs toward the potential of the difference of the threshold potential Vth of the driving transistor 22 from the reference potential Vofs with reference to the initialization potential Vofs at the gate electrode of the driving transistor 22 is hereinafter referred to as threshold value correction process. As the threshold value correction process progresses, the gate-source voltage Vgs of the driving transistor 22 soon converges to the threshold potential Vth of the driving transistor 22. The voltage corresponding to the threshold potential Vth is stored into the storage capacitor 24.

It is to be noted that it is necessary to allow, within a period within which the threshold value correction process is carried out, that is, within a threshold value correction period, current to wholly flow to the storage capacitor 24 side but not to flow to the organic EL element 21 side. To this end, the potential Vcath of the common power supply line 34 is set so that the organic EL element 21 has a cutoff state.

Figure 6A:
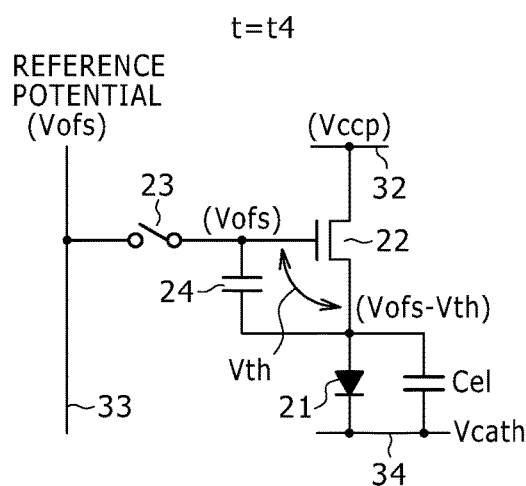

Then, the potential WS of the scanning line 31 changes to the low potential side at time t4, whereupon the writing transistor 23 is placed into a non-conducting state as seen in FIG. 6A. At this time, the gate electrode of the driving transistor 22 is electrically disconnected from the signal line 33 and enters a floating state. However, since the gate-source voltage Vgs is equal to the threshold potential Vth of the driving transistor 22, the driving transistor 22 remains in a cutoff state. Accordingly, the amount of the drain-source current Ids flowing to the driving transistor 22 is very small.

<<Signal Writing & Mobility Correction Period>>

Figure 6B:
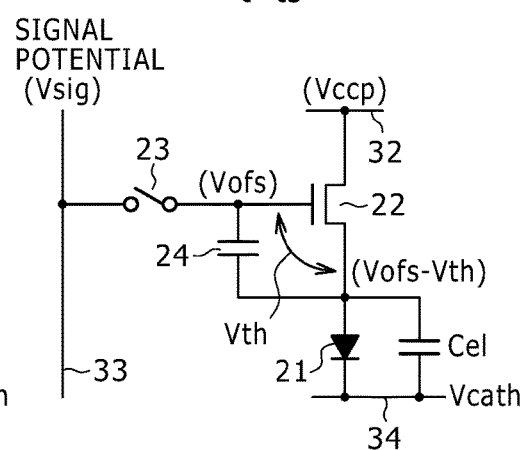
Figure 6C:
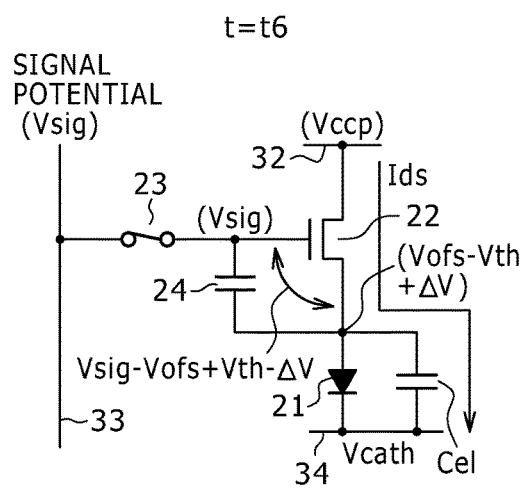

Then at time t5, the potential of the signal line 33 changes over from the reference potential Vofs to the signal voltage Vsig of the image signal as seen in FIG. 6B. Then at time t6, the potential WS of the scanning line 31 changes to the high potential side, whereupon the writing transistor 23 is placed into a conducting state as seen in FIG. 6C to sample and write the signal voltage Vsig of the image signal into the pixel 20.

By the writing of the signal voltage Vsig by the writing transistor 23, the gate potential Vg of the driving transistor 22 becomes equal to the signal voltage Vsig. Then, upon driving of the driving transistor 22 with the signal voltage Vsig of the image signal, the threshold potential Vth of the driving transistor 22 is canceled with the voltage corresponding to the threshold potential Vth stored in the storage capacitor 24. Details of the principle of the threshold value cancellation are hereinafter described in detail.

At this time, the organic EL element 21 remains in a cutoff state, that is, in a high-impedance state. Accordingly, current flowing from the power supply line 32 to the driving transistor 22 in response to the signal voltage Vsig of the image signal, that is, the drain-source current Ids, flows into the equivalent capacitance Cel. Charging of the equivalent capacitance Cel of the organic EL element 21 is started.

By the charging of the equivalent capacitance Cel, the source potential Vs of the driving transistor 22 rises together with lapse of time. At this time, a dispersion of the threshold potential Vth of the driving transistor 22 for each pixel is canceled already, and the drain-source current Ids of the driving transistor 22 exhibits a value which relies upon the mobility μ of the driving transistor 22.

Here, it is assumed that the ratio of the storage voltage Vgs of the storage capacitor 24 to the signal voltage Vsig of the image signal is 1, which is an ideal value. The ratio of the storage voltage Vgs to the signal voltage Vsig is hereinafter referred to sometimes as write gain. In this instance, when the source potential Vs of the driving transistor 22 rises to the potential of Vofs−Vth+ΔV, the gate-source voltage Vgs of the driving transistor 22 becomes Vsig−Vofs+Vth−ΔV.

In particular, the rise amount ΔV of the source potential Vs of the driving transistor 22 acts so as to be subtracted from the voltage stored in the storage capacitor 24, that is, from Vsig−Vofs+Vth. Or in other words, the rise amount ΔV of the source potential Vs acts so as to discharge the accumulated charge of the storage capacitor 24, and therefore, is negatively fed back. Accordingly, the rise amount ΔV of the source potential Vs of the driving transistor 22 is a feedback amount in the negative feedback.

By applying negative feedback of the feedback amount ΔV in accordance with the driving current Ids flowing through the driving transistor 22 to the gate-source voltage Vgs in this manner, the dependency of the drains-source current Ids of the driving transistor 22 upon the mobility μ can be canceled. This process of canceling the dependency upon the mobility μ is a mobility correction process of correcting the dispersion of the mobility μ of the driving transistor 22 for each pixel.

More particularly, since the drain-source current Ids increases as the signal amplitude Vin (=Vsig−Vofs) of the image signal to be written into the gate electrode of the driving transistor 22 increases, also the absolute value of the feedback amount ΔV of the negative feedback increases. Accordingly, a mobility correction process in accordance with the emitted light luminance level is carried out.

Further, if it is assumed that the signal amplitude Vin of the image signal is fixed, then since also the absolute value of the feedback amount ΔV of the negative feedback increases as the mobility μ of the driving transistor 22 increases, a dispersion of the mobility μ for each pixel can be removed. Accordingly, the feedback amount ΔV of the negative feedback can be regarded also as a correction amount of mobility correction. Details of the principle of the mobility correction are hereafter described.

<<Light Emitting Period>>

Figure 6D:
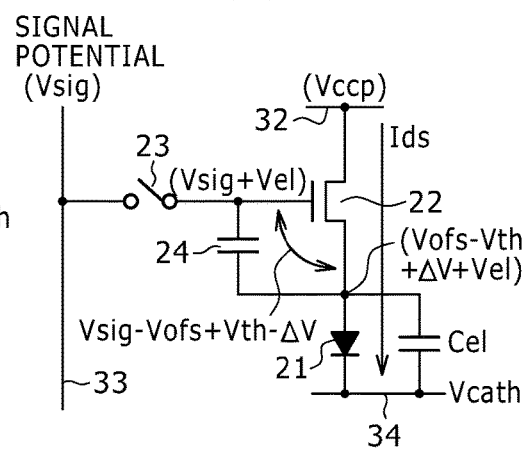

Then, the potential WS of the scanning line 31 changes to the low potential side at time t7, whereupon the writing transistor 23 is placed into a non-conducting state as seen from FIG. 6D. Consequently, the gate potential of the driving transistor 22 is placed into a floating state because it is electrically disconnected from the signal line 33.

Here, when the gate electrode of the driving transistor 22 is in a floating state, since the storage capacitor 24 is connected between the gate and the source of the driving transistor 22, also the gate potential Vg varies in an interlocked relationship or following up relationship with a variation of the source potential Vs of the driving transistor 22. An operation of the gate potential Vg of the driving transistor 22 which varies in an interlocked relationship with a variation of the source potential Vs in this manner is hereinafter referred to as bootstrap operation by the storage capacitor 24.

When the gate electrode of the driving transistor 22 is placed into a floating state and the drain-source current Ids of the driving transistor 22 simultaneously begins to flow to the organic EL element 21, the anode potential of the organic EL element 21 rises in response to the drain-source current Ids.

Then, when the anode potential of the organic EL element 21 exceeds Vthel+Vcath, driving current begins to flow to the organic EL element 21, and consequently, the organic EL element 21 starts emission of light. Further, the rise of the anode potential of the organic EL element 21 is nothing but a rise of the source potential Vs of the driving transistor 22. As the source potential Vs of the driving transistor 22 rises, also the gate potential Vg of the driving transistor 22 rises in an interlinked relationship by the bootstrap operation of the storage capacitor 24.

At this time, if it is assumed that the bootstrap gain is 1 in an ideal state, then the rise amount of the gate potential Vg is equal to the rise amount of the source potential Vs. Therefore, during the light emitting period, the gate-source voltage Vgs of the driving transistor 22 is kept fixed at Vsig−Vofs+Vth−ΔV. Then, at time t8, the potential of the signal line 33 changes over from the signal voltage Vsig of the image signal to the reference potential Vofs.

In a series of circuit operations described above, the processing operations of threshold value correction preparation, threshold value correction, writing of the signal voltage Vsig (signal writing) and mobility correction are executed within one horizontal scanning period (1H). Meanwhile, the processing operations of signal writing and mobility correction are executed in parallel within the period from time t6 to time t7.

It is to be noted here that, although the example described above adopts the driving method wherein the threshold value correction process is executed only once, this driving method is a mere example and the driving method to be adopted is not limited to this. For example, it is possible to adopt a driving method wherein the threshold value correction process is executed within a 1H period within which it is carried out together with the mobility correction and signal writing processes and is further executed by a plural number of times divisionally in a plurality of horizontal scanning periods preceding to the 1H period.

Where the driving method of the divisional threshold value correction just described is adopted, even if the time allocated to one horizontal scanning period is decreased by increase of the number of pixels by increase of the definition, a sufficient period of time can be assured as the threshold value correction period over a plurality of horizontal scanning periods. Consequently, the threshold value correction process can be carried out with certainty.

(Principle of the Threshold Value Cancellation)

Here, the principle of threshold value cancellation, that is, of the threshold value correction, by the driving transistor 22 is described. The threshold value correction process is a process of varying the source voltage Vs of the driving transistor 22 toward a potential of the difference of the threshold voltage Vth of the driving transistor 22 from the initialization potential Vofs for the gate potential Vg of the driving transistor 22 with reference to the initialization potential Vofs as described hereinabove.

The driving transistor 22 operates as a constant current source because it is designed so as to operate in a saturation region. Since the driving transistor 22 operates as a constant current source, the organic EL element 21 is supplied with fixed drain-source current or driving current Ids given by the following expression (1):

$$Ids = (1/2) \cdot \mu (W/L) Cox (Vgs - Vth)^2 \qquad (1)$$

where W is the channel width of the driving transistor 22, L the channel length, and Cox the gate capacitance per unit area.

Figure 7:
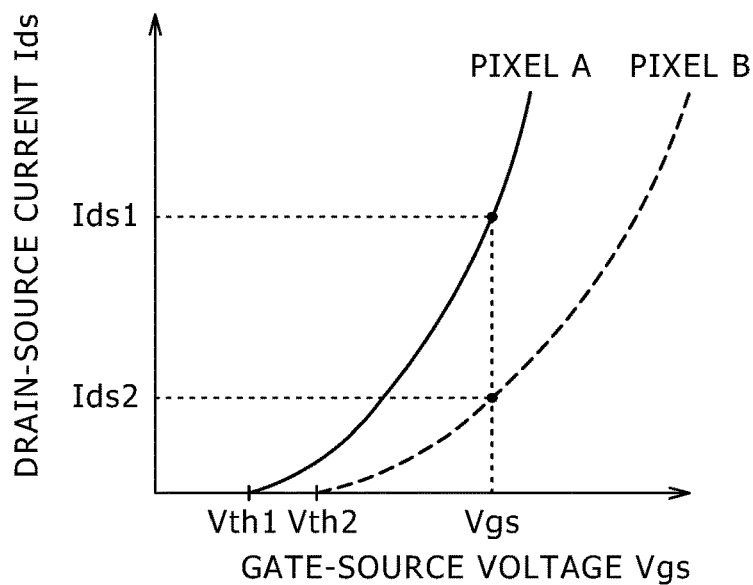
FIG. 7 is a characteristic diagram illustrating a subject to be solved which arises from a dispersion of a threshold voltage of a driving transistor.

FIG. 7 illustrates a characteristic of the drain-source current Ids with respect to the gate-source voltage Vgs of the driving transistor 22.

As seen from the characteristic diagram of FIG. 7, if a cancellation process for a dispersion of the threshold potential Vth of the driving transistor 22 for each pixel is not carried out, then when the threshold potential Vth is Vth1, the drain-source current Ids corresponding to the gate-source potential Vgs becomes Ids1.

In contrast, when the threshold potential Vth is Vth2 (Vth2>Vth1), the drain-source current Ids corresponding to the same gate-source voltage Vgs becomes Ids2 (Ids2<Ids1). In other words, if the threshold potential Vth of the driving transistor 22 fluctuates, then even if the gate-source voltage Vgs is fixed, the drain-source current Ids fluctuates.

On the other hand, in the pixel or pixel circuit 20 having the configuration described above, the gate-source voltage Vgs of the driving transistor 22 upon light emission is Vsig−Vofs+Vth−ΔV. Accordingly, by substituting this into the expression (1), the drain-source current Ids is represented by the following expression (2):

$$Ids=(\tfrac{1}{2})\cdot\mu(W/L)Cox(Vsig-Vofs-\Delta V)^2 \qquad (2)$$

In particular, the term of the threshold potential Vth of the driving transistor 22 is canceled, and the drain-source current Ids to be supplied from the driving transistor 22 to the organic EL element 21 does not rely upon the threshold potential Vth of the driving transistor 22. As a result, even if the threshold potential Vth of the driving transistor 22 varies for each pixel due to a dispersion of the fabrication process or aged deterioration of the driving transistor 22, the drain-source current Ids does not vary, and consequently, the emitted light luminance of the organic EL element 21 can be kept fixed.

(Principle of the Mobility Correction)

Now, the principle of the mobility correction of the driving transistor 22 is described. The mobility correction process is a process of applying negative feedback of the correction amount ΔV corresponding to the drain-source current Ids flowing to the driving transistor 22 to the potential difference between the gate and the source of the driving transistor 22. By the mobility correction process, the dependency of the drain-source current Ids of the driving transistor 22 upon the mobility μ can be canceled.

Figure 8:
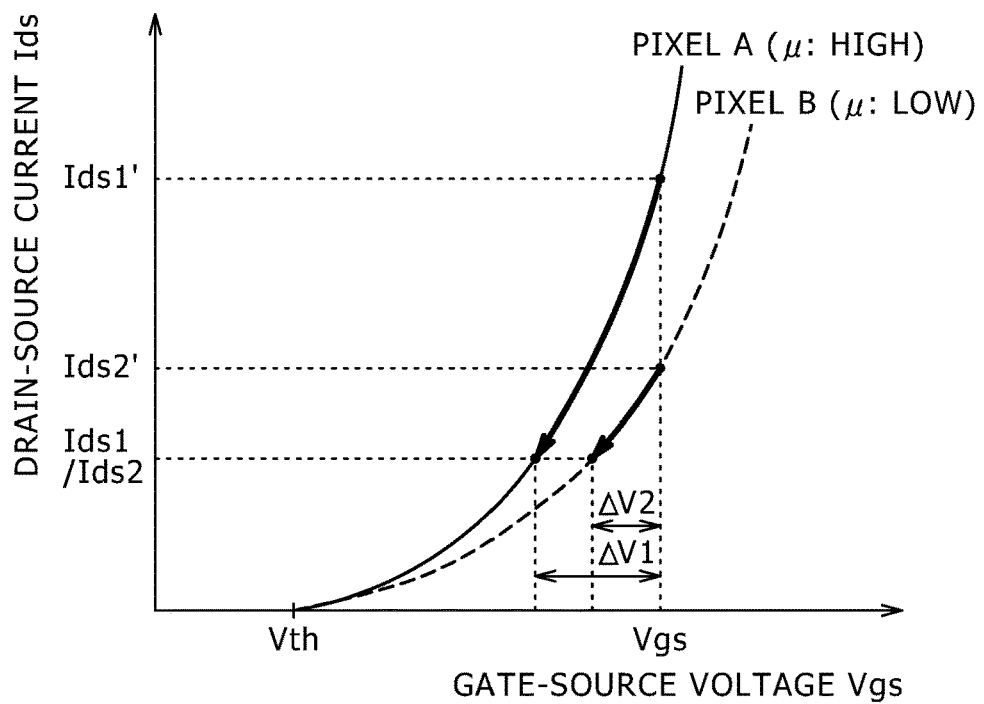
FIG. 8 is a characteristic diagram illustrating a subject to be solved which arises from a dispersion of a mobility of the driving transistor.

FIG. 8 illustrates characteristic curves of a pixel A whose driving transistor 22 has a relatively high mobility μ and a pixel B whose driving transistor 22 has a relatively low mobility μ for comparison. Where the driving transistor 22 is formed from a polycrystalline silicon thin film transistor or the like, it cannot be avoided that the mobility μ disperses among pixels like the pixel A and the pixel B.

It is assumed here that, in a state wherein the pixel A and the pixel B have a dispersion in mobility μ therebetween, the signal amplitudes Vin (=Vsig−Vofs) of an equal level are written into the gate electrodes of the driving transistors 22 in the pixels A and B. In this instance, if correction of the mobility μ is not carried out at all, then a great difference appears between the drain-source current Ids1' flowing through the pixel A having the high mobility μ and the drain-source current Ids2' flowing through the pixel B having the low mobility μ. If a great difference in the drain-source current Ids appears between different pixels originating from the dispersion of the mobility μ among the pixels in this manner, then uniformity of the screen image is damaged.

Here, as apparent from the transistor characteristic expression of the expression (1) given hereinabove, where the mobility μ is high, the drain-source current Ids is great. Accordingly, the feedback amount ΔV in the negative feedback increases as the mobility μ increases. As seen from FIG. 8, the feedback amount ΔV1 in the pixel A of the high mobility μ is greater than the feedback amount ΔV2 in the pixel B having the low mobility μ.

Therefore, if negative feedback is applied to the gate-source voltage Vgs with the feedback amount ΔV in accordance with the drain-source current Ids of the driving transistor 22 by the mobility correction process, then the negative feedback amount increases as the mobility μ increases. As a result, the dispersion of the mobility μ among the pixels can be suppressed.

In particular, if correction of the feedback amount ΔV1 is applied in the pixel A having the high mobility μ, then the drain-source current Ids drops by a great amount from Ids1' to Ids1. On the other hand, since the feedback amount ΔV2 in the pixel B having the low mobility μ is small, the drain-source current Ids decreases from Ids2' to Ids2 and does not drop by a great amount. As a result, the drain-source current Ids1 in the pixel A and the drain-source current Ids2 in the pixel B become substantially equal to each other, and consequently, the dispersion of the mobility μ among the pixels is corrected.

In summary, where the pixel A and the pixel B which are different in the mobility μ therebetween are considered, the feedback amount ΔV1 in the pixel A having the high mobility μ is greater than the feedback amount ΔV2 in the pixel B having the low mobility μ. In short, as the mobility μ increases, the feedback amount ΔV increases and the reduction amount of the drain-source current Ids increases.

Accordingly, if the negative feedback is applied to the gate-source voltage Vgs with the feedback amount ΔV in accordance with the drain-source current Ids of the driving transistor 22, then the current value of the drain-source current Ids is uniformized among the pixels which are different in the mobility μ from each other. As a result, the dispersion of the mobility μ among the pixels can be corrected. Thus, the process of applying negative feedback to the gate-source voltage Vgs of the driving transistor 22 with the feedback amount ΔV in accordance with the current flowing through the driving transistor 22, that is, with the drain-source current Ids, is the mobility correction process.

Here, a relationship between the signal voltage or sampling potential Vsig of the image signal and the drain-source current Ids of the driving transistor 22 depending upon whether or not threshold value correction and mobility correction are carried out in the pixel or pixel circuit 20 shown in FIG. 2 is described with reference to FIGS. 9A to 9C.

Figure 9A:
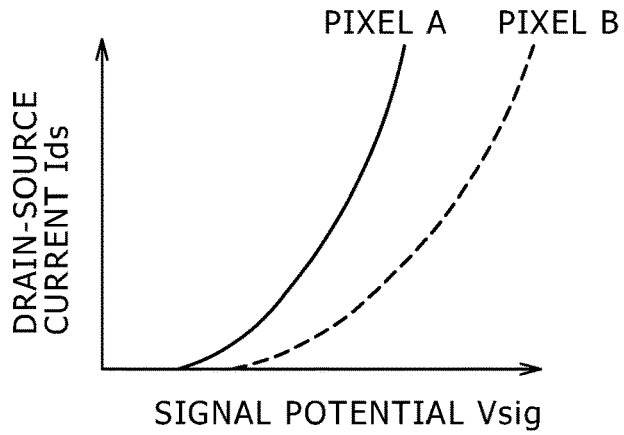
FIGS. 9A to 9C are characteristic diagrams illustrating relationships between a signal voltage of an image signal and drain-source current of the driving transistor depending upon whether or not threshold value correction and/or mobility correction are carried out.
Figure 9B:
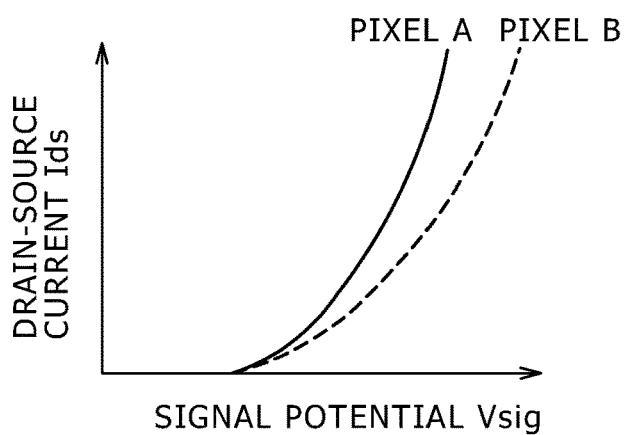
Figure 9C:
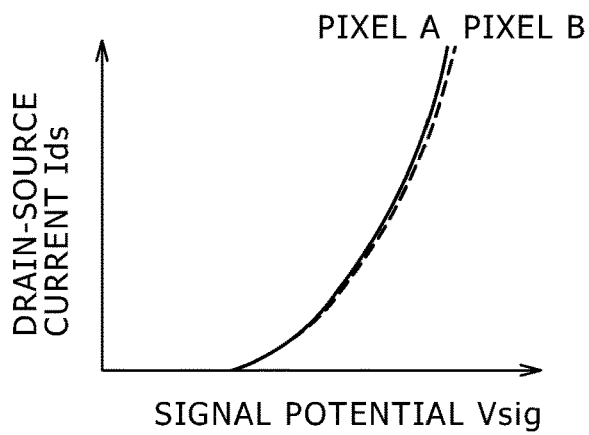

FIG. 9A illustrates the relationship in a case wherein none of the threshold value correction process and the mobility correction process is carried out, and FIG. 9B illustrates the relationship in another case wherein only the threshold value correction process is carried out without carrying out the mobility correction process while FIG. 9C illustrates the relationship in a further case wherein both of the threshold value correction process and the mobility correction process are carried out. As seen in FIG. 9A, when none of the threshold value correction process and the mobility correction process is carried out, the drain-source current Ids is much different between the pixels A and B arising from a dispersion of the threshold potential Vth and the mobility μ between the pixels A and B.

In contrast, where only the threshold value correction process is carried out, although the dispersion of the drain-source current Ids can be reduced to some degree as seen in FIG. 9B, the difference in the drain-source current Ids between the pixels A and B arising from the dispersion of the mobility μ between the pixels A and B remains. Then, if both of the threshold value correction process and the mobility correction process are carried out, then the difference in the drain-source current Ids between the pixels A and B arising from the dispersion of the mobility μ for each of the pixels A and B can be almost eliminated as seen in FIG. 9C. Accordingly, at any gradation, a luminance dispersion among the organic EL elements 21 does not appear, and a display image of favorable picture quality can be obtained.

Further, since the pixel 20 shown in FIG. 2 has a function of a bootstrap operation by the storage capacitor 24 described hereinabove in addition to the correction functions for threshold value correction and mobility correction, the following operation and effects can be achieved.

In particular, even if the source potential Vs of the driving transistor 22 varies together with aged deterioration of the I-V characteristic of the organic EL element 21, the gate-source voltage Vgs of the driving transistor 22 can be kept fixed by a bootstrap operation by the storage capacitor 24. Accordingly, the current flowing through the organic EL element 21 does not vary but is fixed. As a result, since also the emitted light luminance of the organic EL element 21 is kept fixed, even if the I-V characteristic of the organic EL element 21 undergoes aged deterioration, image display which is free from luminance deterioration by the aged deterioration can be implemented.

(Fault by a Shift of the Threshold Voltage of the Writing Transistor)

Here, the operating point of the writing transistor 23 when the organic EL element 21 emits light, particularly when the organic EL element 21 displays the white, is studied. As apparent from the circuit operation described above, after writing of the signal voltage Vsig of the image signal ends and the writing transistor 23 enters a non-conducting state, the gate voltage Vg of the driving transistor 22 rises in an interlocking relationship with a rise of the source voltage Vs through a bootstrap operation. Therefore, the gate voltage Vg of the driving transistor 22 becomes higher than the signal voltage Vsig.

On the other hand, if a configuration for applying the reference potential Vofs for the initialization of the gate voltage Vg of the driving transistor 22 is applied through the signal line 33 in order to execute the threshold value correction process is adopted, then the potential of the signal line 33 exhibits repetitions of changeover between the reference voltage Vofs and the signal voltage Vsig in a period of 1H.

Figure 10:
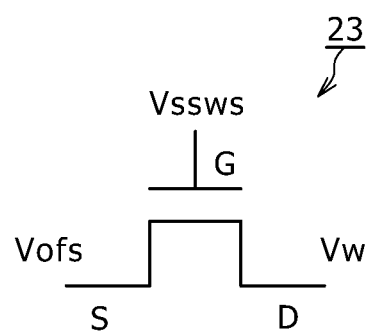
FIG. 10 is an equivalent circuit diagram illustrating a potential relationship of the electrodes of a writing transistor when the white is displayed.

FIG. 10 illustrates a potential relationship of the electrodes of the writing transistor 23 upon white display. Upon white display, an off voltage Vssws for placing the writing transistor 23 into a non-conducting state is applied to the gate electrode G of the writing transistor 23 and the reference voltage Vofs is applied to the source electrode S of the writing transistor 23 while a white voltage Vw corresponding to the white gradation is applied to the drain electrode D of the writing transistor 23. The off voltage Vssws, reference voltage Vofs and white voltage Vw have a voltage relationship of Vssws<Vofs<Vw.

Figure 11:
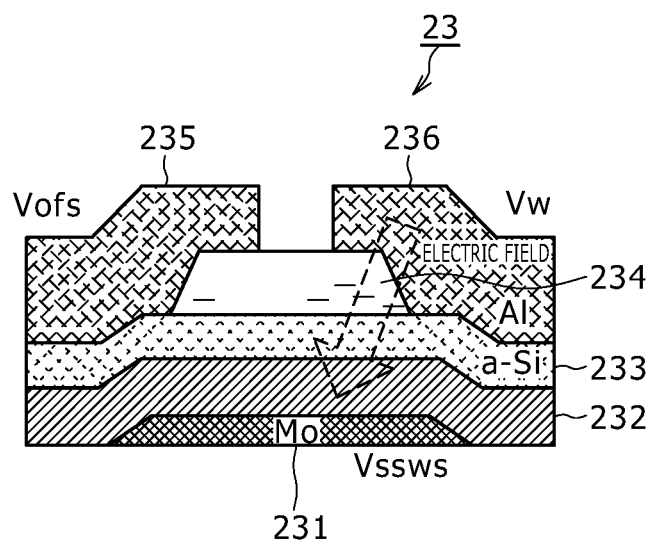
FIG. 11 is a sectional view showing an example of a sectional structure of the writing transistor.

FIG. 11 shows an example of a sectional structure of the writing transistor 23. Referring to FIG. 11, a gate electrode 231 is formed from molybdenum (Mo) or the like on a substrate which corresponds to the glass substrate 201 shown in FIG. 3, and a semiconductor layer 233 of, for example, amorphous silicon (a-Si) is layered on the gate electrode 231 with a gate insulating film 232 interposed therebetween.

A portion of the semiconductor layer (a-Si) 233 which opposes to the gate electrode 231 forms a channel formation region. An insulating film 234 is formed on the channel formation region. A source electrode 235 and a drain electrode 236 both made of aluminum (Al) or the like are electrically connected to a source region and a drain region of the semiconductor layer 233, respectively, between which the channel formation region is sandwiched.

In the writing transistor 23 having the configuration described above, when the white is to be displayed, the off voltage Vssws is applied to the gate electrode 231 and the white voltage Vw is applied to the drain electrode 236 so that a high electric field is formed between the gate electrode 231 and the drain electrode 236. Here, the drain voltage of the writing transistor 23 is equal to the gate voltage of the driving transistor.

If an electric field continues to be generated between the gate electrode 231 and the drain electrode 236 of the writing transistor 23, then electrons in the semiconductor layer 233 which are to form the channel are trapped in the insulating film 234 positioned above the semiconductor layer 233 and tend to generate a reverse electric field in a direction in which the electric field is to be canceled. Since the trapped electrons exist also when the writing transistor 23 conducts, the threshold voltage Vthws of the writing transistor 23 is shifted or fluctuated to the negative side by the reverse electric field. The phenomenon that the threshold voltage Vthws is shifted to the negative side appears conspicuously as time passes.

Incidentally, as the increase in size and definition of a display panel advances, the wiring line resistance and the parasitic capacitance of the scanning line 31 for transmitting the writing scanning signal WS in the form of a pulse to be applied to the gate electrode of the writing transistor 23 increase. Then, where the wiring line resistance or the parasitic capacitance of the scanning line 31 increases, as the distance from the input end of the display panel 70 increases, the waveform of the writing scanning signal WS becomes blunt.

Meanwhile, the mobility correction process is executed in parallel to the writing process of the signal voltage Vsig of the image signal by the writing transistor 23. As apparent from the timing waveform diagram of FIG. 4, the mobility correction period, that is, the signal writing period, depends upon the waveform of the writing scanning signal WS. Therefore, if the threshold voltage Vthws of the writing transistor 23 shifts to the negative side in a state wherein the waveform of the writing scanning signal WS is blunt, then the mobility correction time when the white is to be displayed or the black is to be displayed becomes longer by a period of time corresponding to the shift amount of the threshold voltage.

Figure 12:
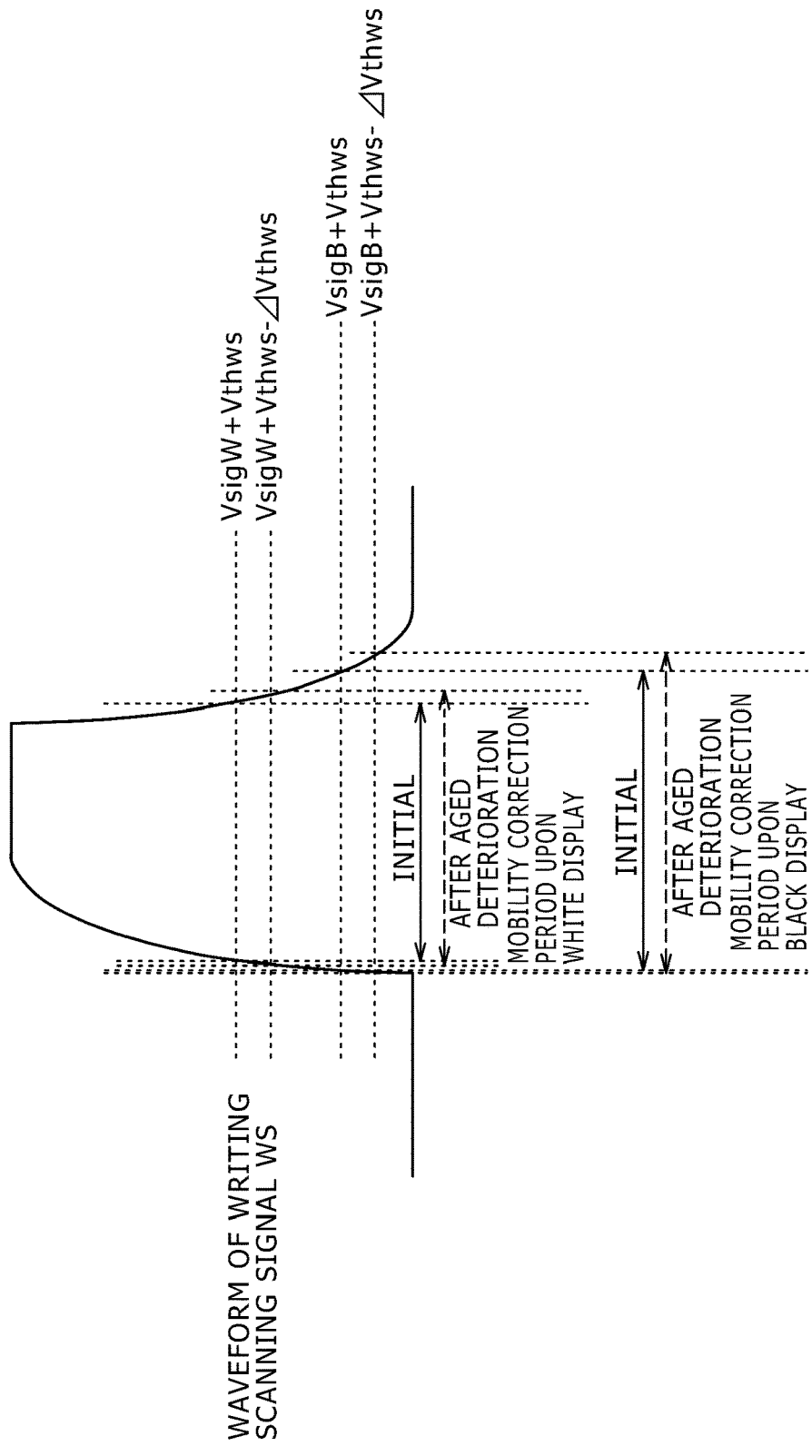
FIG. 12 is a waveform diagram illustrating a transition waveform of a writing scanning signal in a state wherein it is deformed at a rising edge and a falling edge thereof.

FIG. 12 illustrates a transition waveform of the writing scanning signal WS in a state wherein it is blunt at a rising edge and a fall edge thereof. Referring to FIG. 12, reference character VsigW denotes a white signal voltage corresponding to the white gradation; VsigB a black signal voltage corresponding to the black gradation; and ΔVthws a shift amount of the threshold voltage Vthws of the writing transistor 23.

As can be seen apparently from the waveform diagram of FIG. 12, particularly when the white or the black is displayed, if the threshold voltage Vthws of the writing transistor 23 shifts by the shift amount ΔVthws to the negative side, then the mobility correction period increases by the shift amount ΔVthws of the threshold voltage Vthws. This variation of the threshold voltage Vthws appears conspicuously particularly at a falling edge of the waveform of the writing scanning signal WS. The reason is such as described below.

As seen from the waveform diagram of FIG. 12, in the transition waveform of the writing scanning signal WS, a transition ending portion of the rising/falling edges exhibits a higher degree of blunting of the waveform than a transition starting portion of the rising/falling edges. The amplitude of the white signal voltage VsigW is equal to or smaller than one half that of the writing scanning signal WS. Accordingly, as apparently seen from the waveform diagram of FIG. 12, the variation of the mobility correction period arising from the shift of the threshold voltage Vthws of the writing transistor 23 to the negative side appears conspicuously particularly at the falling edge of the waveform of the writing scanning signal WS.

Further, as apparent from the foregoing description of the circuit operation, the mobility correction process is carried out while the source voltage Vs of the driving transistor 22 is raised. Therefore, as the mobility correction period increases, the rises of the source voltage Vs of the driving transistor 22 increases. Consequently, the gate-source voltage Vgs of the driving transistor 22 drops and the current to flow to the organic EL element 21 decreases, and as a result, the emitted light luminance decreases as time passes or such a picture quality defect as stripes or luminance unevenness appears.

Figure 26:
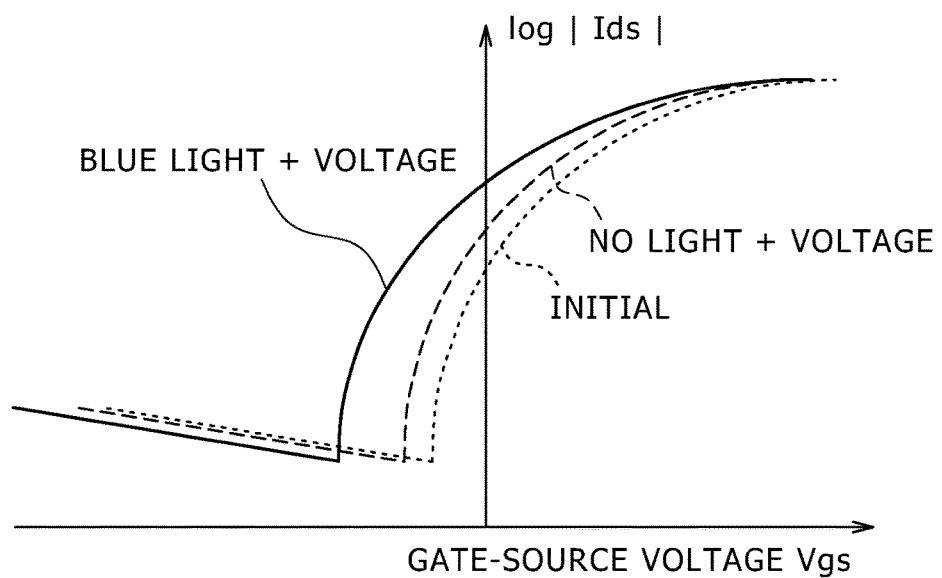
FIG. 26 is a diagrammatic view of a transistor characteristic illustrating a manner wherein a characteristic of a transistor varies by a great amount when blue light is inputted to the channel of the transistor.

Further, as described hereinabove, also when light of high energy is inputted to the channel of the writing transistor 23, the threshold voltage of the writing transistor 23 shifts to the negative side (refer to FIG. 26). Where the R, G and B pixels (subpixels) are disposed such that the B pixel is positioned centrally, the B pixel is influenced by blue light only when it itself emits light.

On the other hand, since the R and G pixels are positioned adjacent the B pixel, they are influenced by emitted light of the B pixel even when they themselves emit no light. At this time, not only the writing transistor 23 but also the driving transistor 22 is influenced by blue light such that the characteristic thereof is shifted. Where not only an influence of self light emission but also an influence of light emission of adjacent pixels is had, it is very difficult to compensate for the current variation in correction processes such as the mobility correction process.

Figure 13:
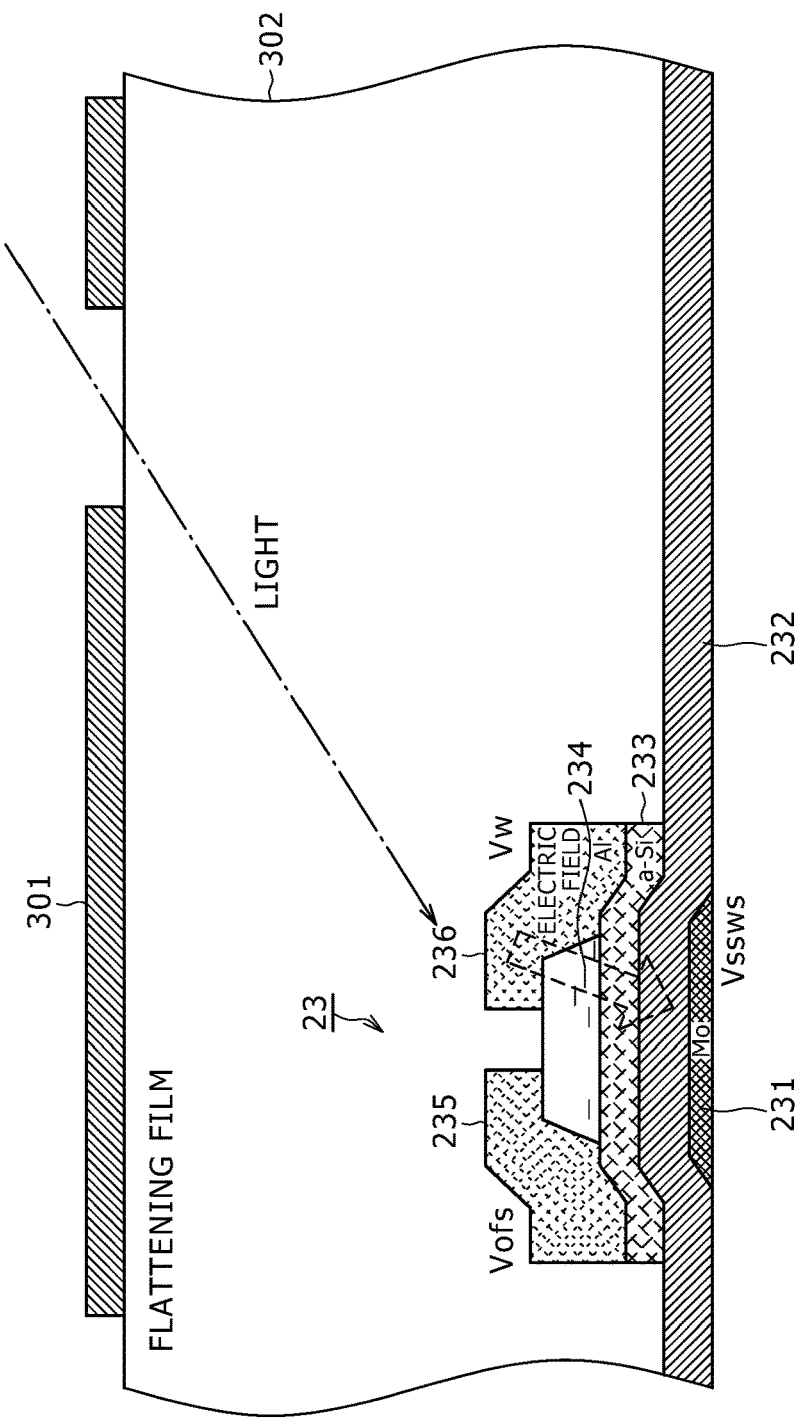
FIG. 13 is a sectional view of a pixel section illustrating an example of a method of preventing a pixel from being influenced by blue light from an adjacent pixel.

As a method of preventing an influence of blue light from an adjacent pixel, a method seems applicable wherein the writing transistor 23 is covered with a metal wiring layer 301 in the same layer as that of the anode electrode of the organic EL element 21 as seen in FIG. 13 to block blue light. However, with the method described, although a light blocking effect can be expected to some degree, since it is necessary to form a flattening film 302, which corresponds to the insulating flattening film 203 shown in FIG. 3, with an increased thickness in order to maintain the flatness, full light blocking cannot be expected even if the metal wiring layer 301 is disposed on the writing transistor 23.

Characteristics of the Present Embodiment

Therefore, the present embodiment adopts the following pixel light blocking layout in an organic EL display apparatus wherein a plurality of subpixels which form one pixel which forms a unit in formation of a color image are disposed adjacent each other. In particular, the present embodiment adopts a light blocking layout structure wherein, at least for a second subpixel from among the plural subpixels which is positioned adjacent a first subpixel which emits light of the shortest wavelength, a light blocking member having a width greater than the channel length or the channel width of a transistor which forms the second subpixel is provided so as to be positioned between the first and second subpixels.

Although description here is given of a case wherein the plural subpixels which form one pixel which forms a unit in formation of a color image are formed, for example, from a combination of R, G and B pixels or subpixels, they are not limited to the specific combination. In the case of the combination of R, G and B pixels, the emitted light from the B pixel has the shortest wavelength. Accordingly, the B pixel serves as the first subpixel, and each of the R and G pixels serves as the second subpixel.

The transistor which forms the second subpixel may be, for example, the writing transistor 23. However, as described above, not only a characteristic shift of the writing transistor 23 is caused by an influence of blue light of the B pixel, but also a characteristic shift of the driving transistor 22 is caused by an influence of blue light. Accordingly, the transistor which serves as the second subpixel is not limited to the writing transistor 23.

Where a light blocking member is provided for the second subpixel with respect to the first subpixel such that the width thereof is greater than the channel length or the channel width of the transistor which forms the second subpixel as described above, light emitted from the first subpixel can be blocked with certainty. Accordingly, a characteristic shift caused by inputting of light having high energy to the channel of the transistor which forms the second subpixel, particularly a shift of the threshold voltage Vth to the negative side, can be suppressed.

Since a shift of the threshold voltage of the writing transistor 23 is suppressed, the fluctuation of the mobility correction period or signal writing period which depends upon the waveform of the writing scanning signal WS can be reduced. Where the fluctuation of the mobility correction period is reduced, the rise of the source voltage Vs of the driving transistor 22 arising from the fluctuation can be suppressed. Therefore, reduction of the current to flow to the organic EL element 21 is suppressed, and consequently, reduction of the emitted light luminance with respect to time and occurrence of a fault in picture quality such as stripes or luminance unevenness can be suppressed.

Such effects as described above can be obtained from the light blocking layout structure for a pixel according to the present embodiment. In the following, particular working examples of the light blocking layout structure are described.

1-1. Working Example 1

Figure 14:
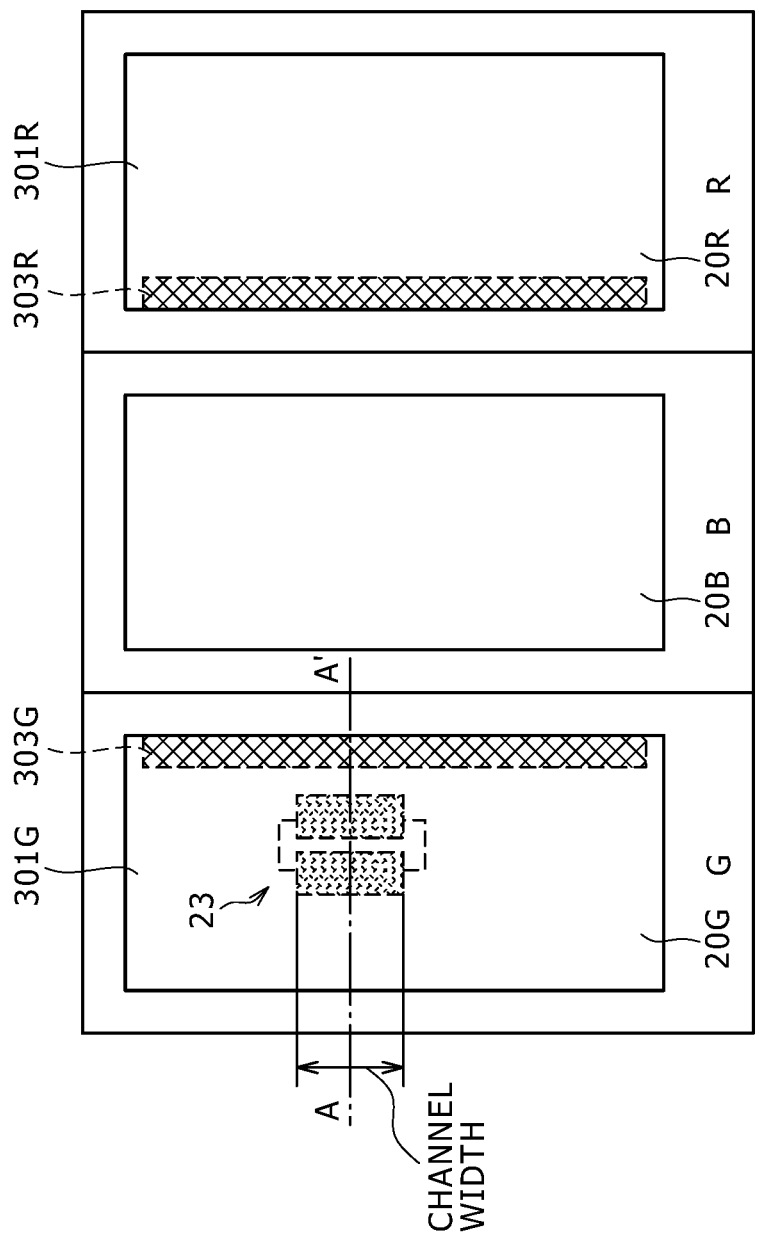
FIG. 14 is a plan view showing a light blocking layout structure according to a working example 1.
Figure 15:
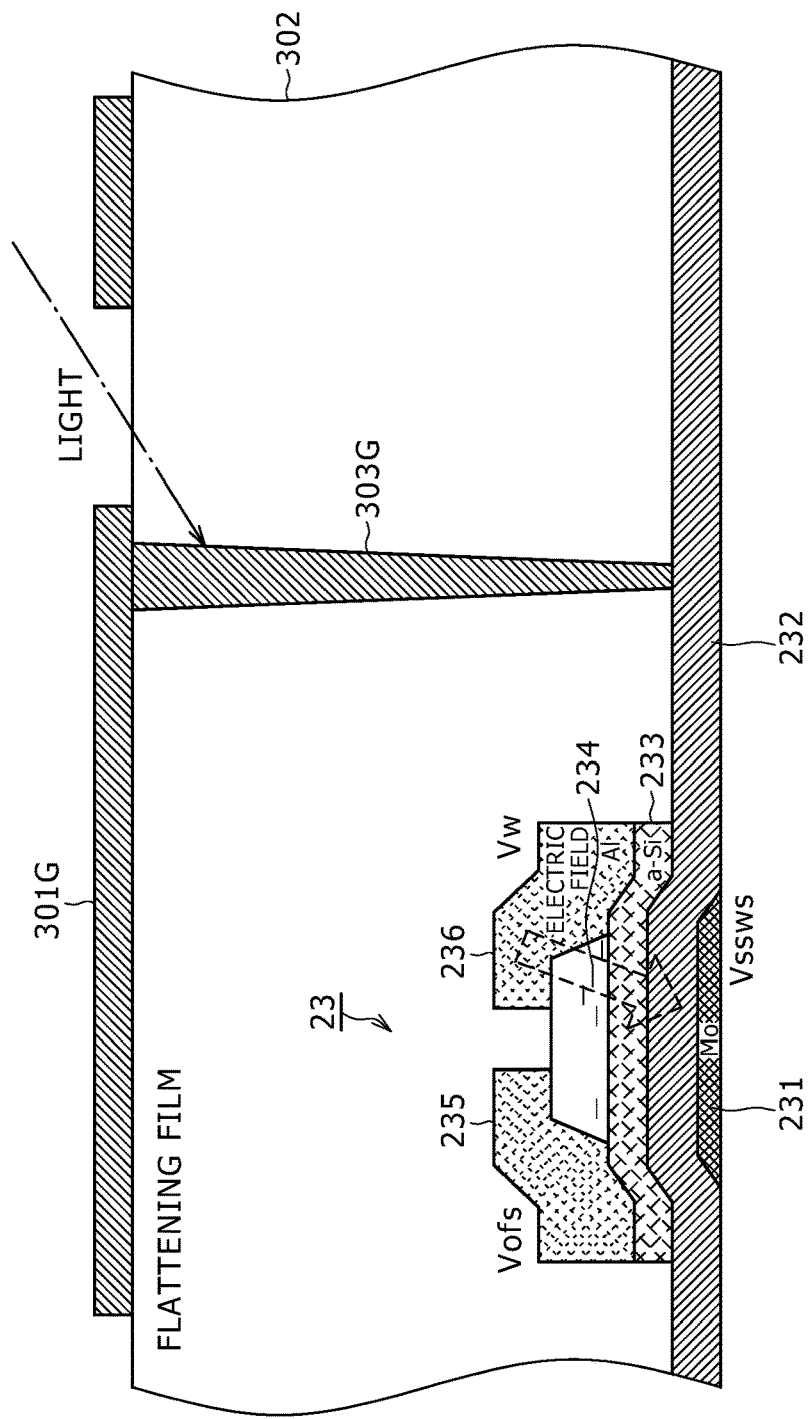
FIG. 15 is a sectional view taken along line A-A' of FIG. 14 showing a sectional structure of the light block layout structure.

FIG. 14 is a plan view showing the light blocking layout structure according to a working example 1. Here, as an example, the light blocking layout structure exhibits a color array wherein R, G and B pixels or subpixels 20R, 20G and 20B are arranged such that the B pixel 20B is positioned centrally and the R and G pixels 20R and 20B are positioned on the opposite sides of the B pixel 20B. FIG. 15 shows a sectional structure of the light blocking layout structure taken along line A-A' of FIG. 14.

Since the B pixel 20B is disposed centrally as seen in FIG. 14, transistors in the R and G pixels 20R and 20G positioned on the opposite sides of the B pixel 20B are influenced by irradiation of blue light emitted from the B pixel 20B. In order to prevent incidence of blue light from the B pixel 20B, a metal wiring layer 301G is provided in the layer same as that of the anode electrode of the G pixel 20G on the writing transistor 23, on the organic EL element 21 side of FIG. 3, with the flattening film 302 interposed therebetween similarly as in the case of the light blocking layout structure described hereinabove with reference to FIG. 13. The metal wiring layer 301G is formed from a metal material having high reflectivity such as aluminum and same as that of the wiring line for the anode electrode.

The G pixel 20G further includes a light blocking member 303G provided in parallel to the longitudinal direction of the G pixel 20G between the G pixel 20G and the B pixel 20B in a region of the metal wiring layer 301G as shown in FIGS. 14 and 15. The light blocking member 303G has a width greater than the channel width of the writing transistor 23 as apparently seen particularly from FIG. 14 and is embedded in a hole formed in the metal wiring layer 301G. As the material of the light blocking member 303G, for example, a material same as that of the metal wiring layer 301G, that is, a metal material having high reflectivity such as aluminum, is used.

While the light blocking layout structure of the G pixel 20G is described here, also the R pixel 20R has a light blocking layout structure basically same as that of the G pixel 20G. The light blocking layout structure of the G pixel 20G and the light blocking layout structure of the R pixel 20R are symmetrical to each other with respect to the center line of the B pixel 20B.

Where the light blocking members 303G and 303R are provided between the B pixel 20B and the R and G pixels 20R and 20B positioned adjacent to and on the opposite sides of the B pixel 20B in this manner, respectively, blue light emitted from the B pixel 20B can be blocked with certainty so as not to be inputted to the pixels 20R and 20G. Therefore, the characteristic shift by an influence of irradiation of blue light upon the channel of the writing transistor 23 can be suppressed low, and consequently, reduction of the current to flow to the organic EL element 21 and occurrence of a fault in picture quality such as stripes or luminance unevenness can be suppressed.

Modification 1 to the Working Example 1

Figure 16:
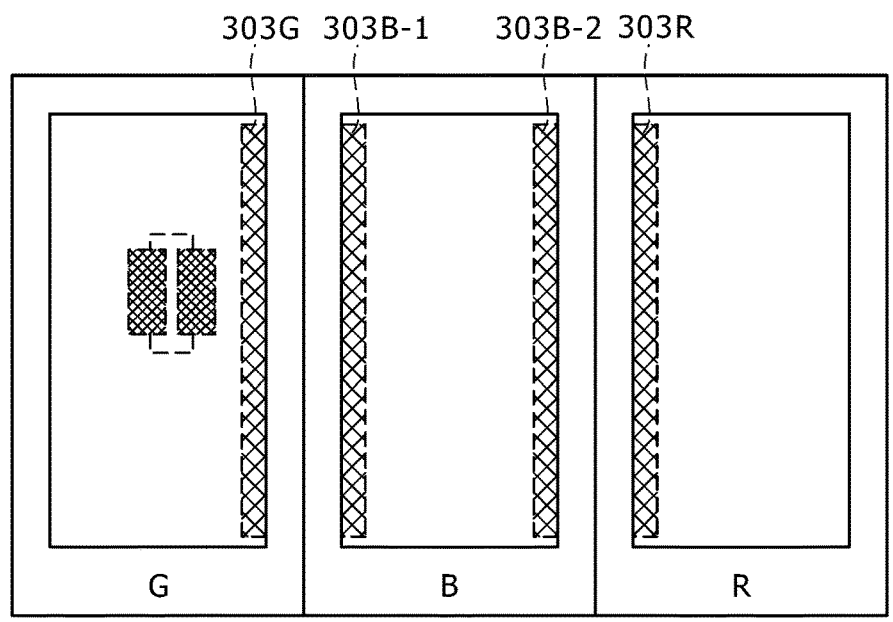
FIGS. 16 and 17 are plan views showing light blocking layout structures according to modifications 1 and 2 to the working example 1 of FIG. 14.

FIG. 16 is a plan view showing a light blocking layout structure according to a modification 1 to the working example 1. In the light blocking layout structure according to the modification 1, light blocking members 303B-1 and 303B-2 having a width greater than the channel width of the writing transistor 23 are provided between R and G pixels 20R and 20B positioned adjacent to and on the opposite sides of the B pixel 20B.

With the light blocking layout structure according to the modification 1, blue light emitted from the B pixel 20B can be prevented from being reflected by the light blocking members 303G and 303R of the adjacent pixels and entering the B pixel 20B. Accordingly, not only with regard to the R and G pixels 20R and 20B but also with regard to the B pixel 20B, the characteristic shift by an influence of irradiation of blue light can be suppressed to a small amount.

Modification 2 to the Working Example 1

Figure 17:
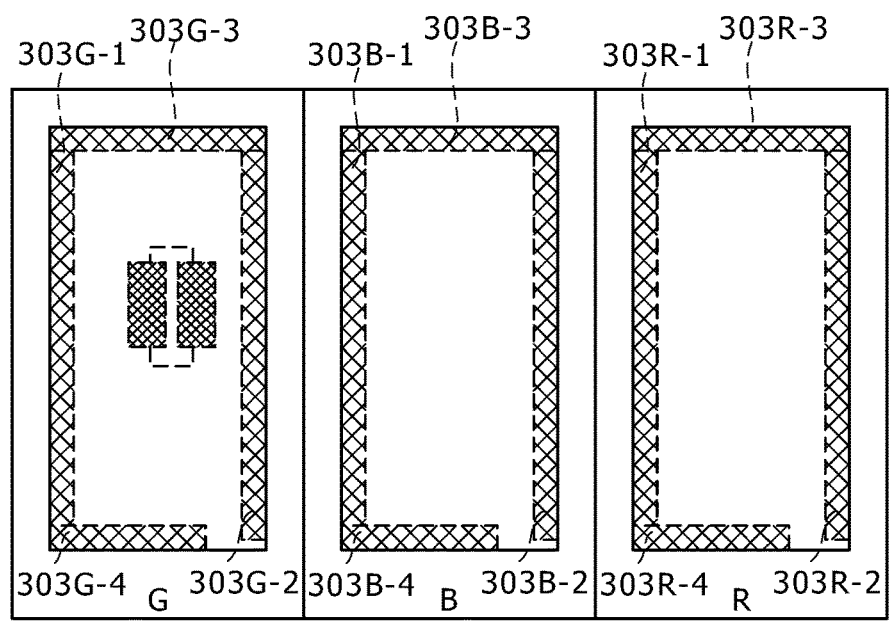

FIG. 17 is a plan view showing a light blocking layout structure according to a modification 2 to the working example 1. Referring to FIG. 17, in the light blocking layout structure according to present modification 2, each of the pixels 20G, 20B and 20R is blocked against light by light blocking members 303-1 to 303-4 in the four directions of leftward, rightward, upward and downward directions of the writing transistor 23.

In particular, the writing transistor 23 in the G pixel 20G is blocked on the left and right thereof against light by the light blocking members 303G-1 and 303G-2. The light blocking members 303G-1 and 303G-2 have a width greater than the channel width of the writing transistor 23. Further, the writing transistor 23 is blocked on the upper and lower sides thereof against light by the light blocking members 303G-3 and 303G-4. The light blocking members 303G-3 and 303G-4 have a width greater than the channel length of the writing transistor 23.

Also for the B and R pixels 20B and 20R, a light blocking layout structure basically similar to that for the G pixel 20G is provided.

With the light blocking layout structure according to the present modification 2, the writing transistors 23 in the pixels 20G, 20B and 20R can be shielded optically substantially fully from blue light emitted from the B pixel 20B. Accordingly, with regard to each of the pixels 20G, 20B and 20R, the characteristic shift by an influence of irradiation of blue light can be suppressed with a higher degree of certainty.

Modification 3 to the Working Example 1

Figure 18:
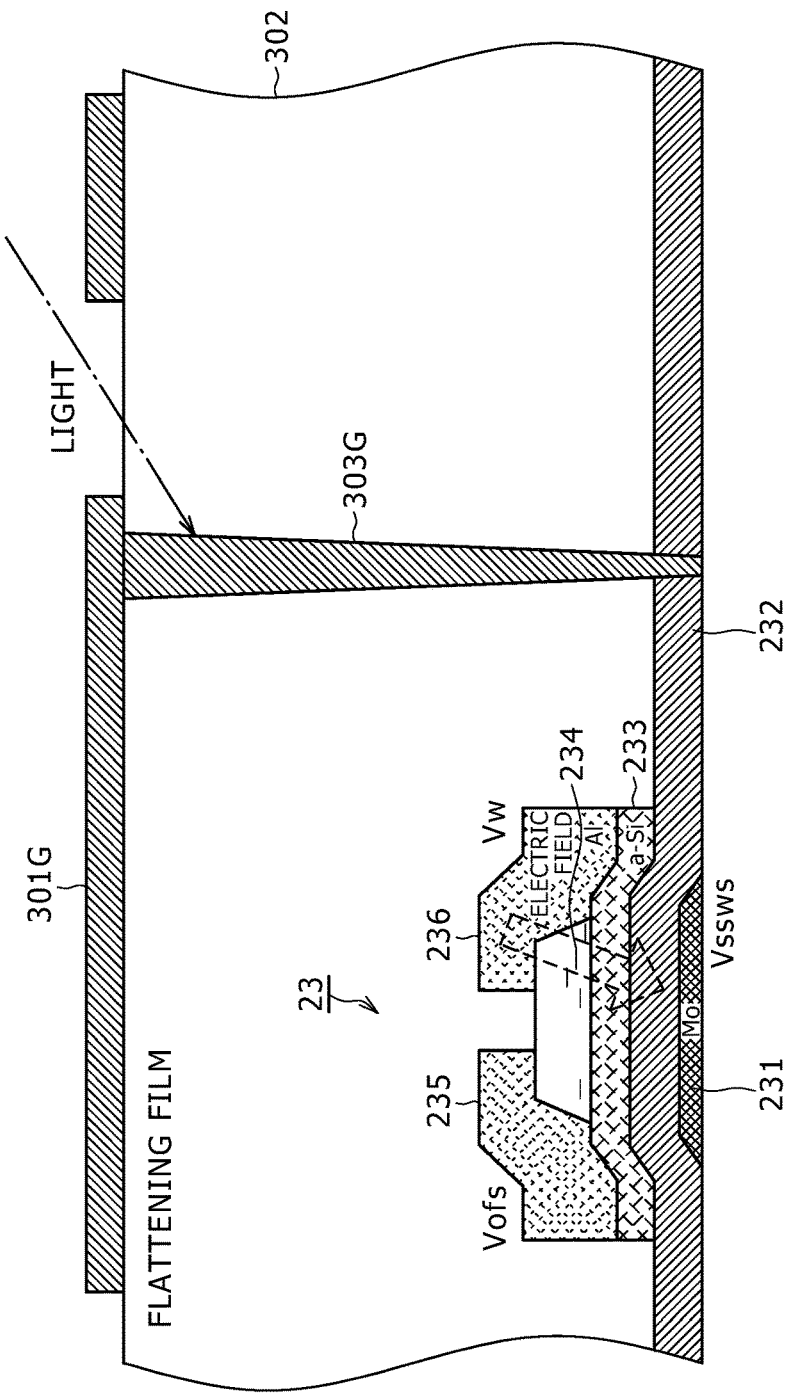
FIGS. 18 and 19 are sectional views showing light blocking layout structures according to modifications 3 and 4 to the working example 1 of FIG. 14.

FIG. 18 is a sectional view showing a light blocking layout structure according to a modification 3 to the working example 1. Referring to FIG. 18, in the light blocking layout structure according to the third modification, a lower end portion of a light blocking member 303B is embedded in a gate insulating film 232 which corresponds to the insulating film 202 shown in FIG. 3.

While the light blocking member 303B for the B pixel 20B is shown in FIG. 18, also the light blocking members 303B-1 and 303B-2 in the modification 1 and the insulating films 303G-1 to 303G-4 in the modification 2 can be embedded at a lower end portion thereof in a gate insulating film 304. The foregoing description applies similarly to the B and R pixels 20B ad 20R.

With the light blocking layout structure according to the present modification 3, since the lower end portion of the light blocking member 303B is embedded in the gate insulating film 304, also leakage light from between the lower end portion of the light blocking member 303B and the gate insulating film 304 can be blocked with certainty. Accordingly, in each of the pixels 20G, 20B and 20R, the characteristic shift by an influence of irradiation of blue light can be suppressed with certainty.

Modification 4 to the Working Example 1

Figure 19:
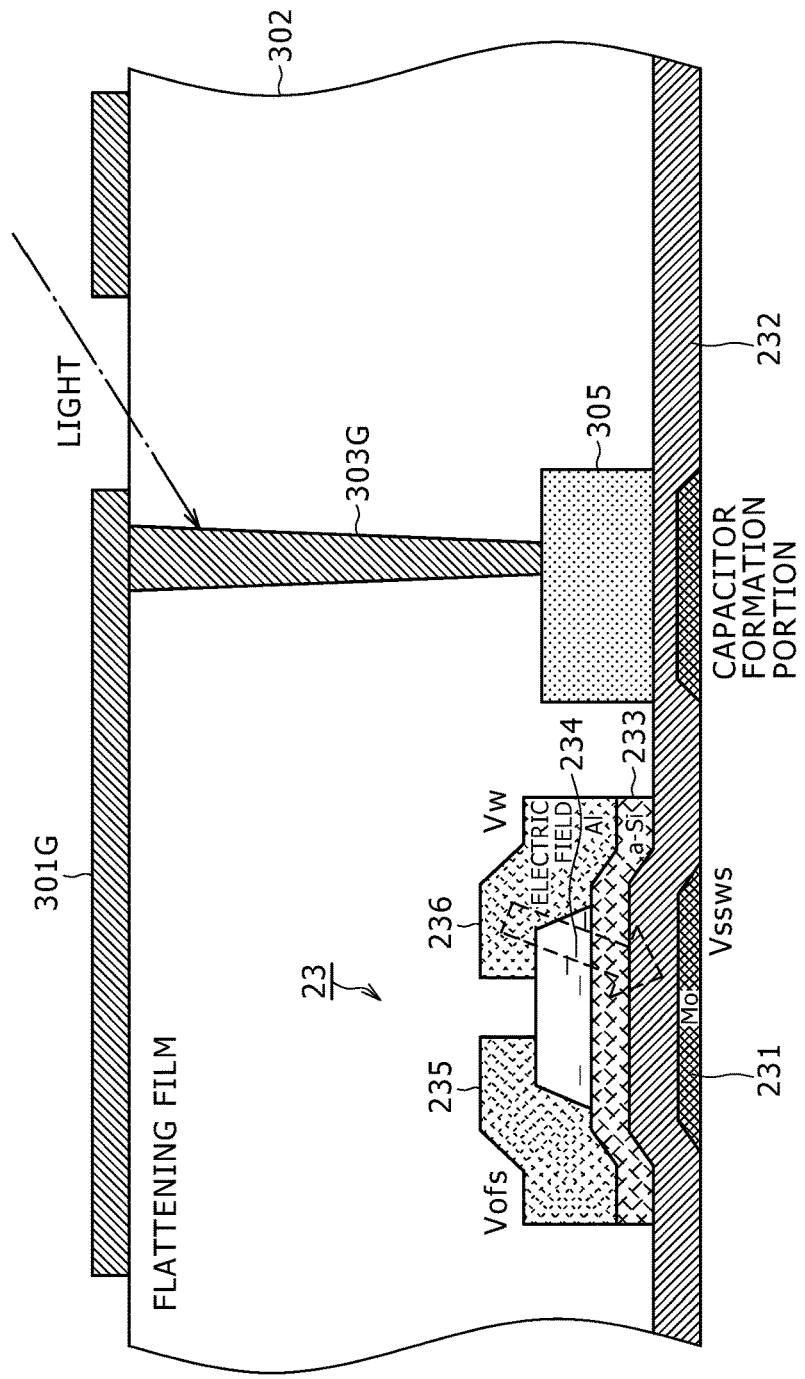

FIG. 19 is a sectional view showing a light blocking layout structure according to a modification 4 to the working example 1. Referring to FIG. 19, in the light blocking layout structure according to the modification 4 to the working example 1, a lower end portion of the light blocking member 303B is electrically connected to a wiring line 305 for the source electrode of the driving transistor 22.

With the light blocking layout structure according to the present modification 4, since the light blocking member 303B establishes electric connection between the source electrode of the driving transistor 22 and the anode electrode of the organic EL element 21, the light blocking member 303B can be used also as a contact portion for the electric connection. Consequently, the light blocking layout structure against blue light can be implemented without inviting complication of the pixel structure by the provision of the light blocking member 303B.

1-2. Working Example 2

Figure 20:
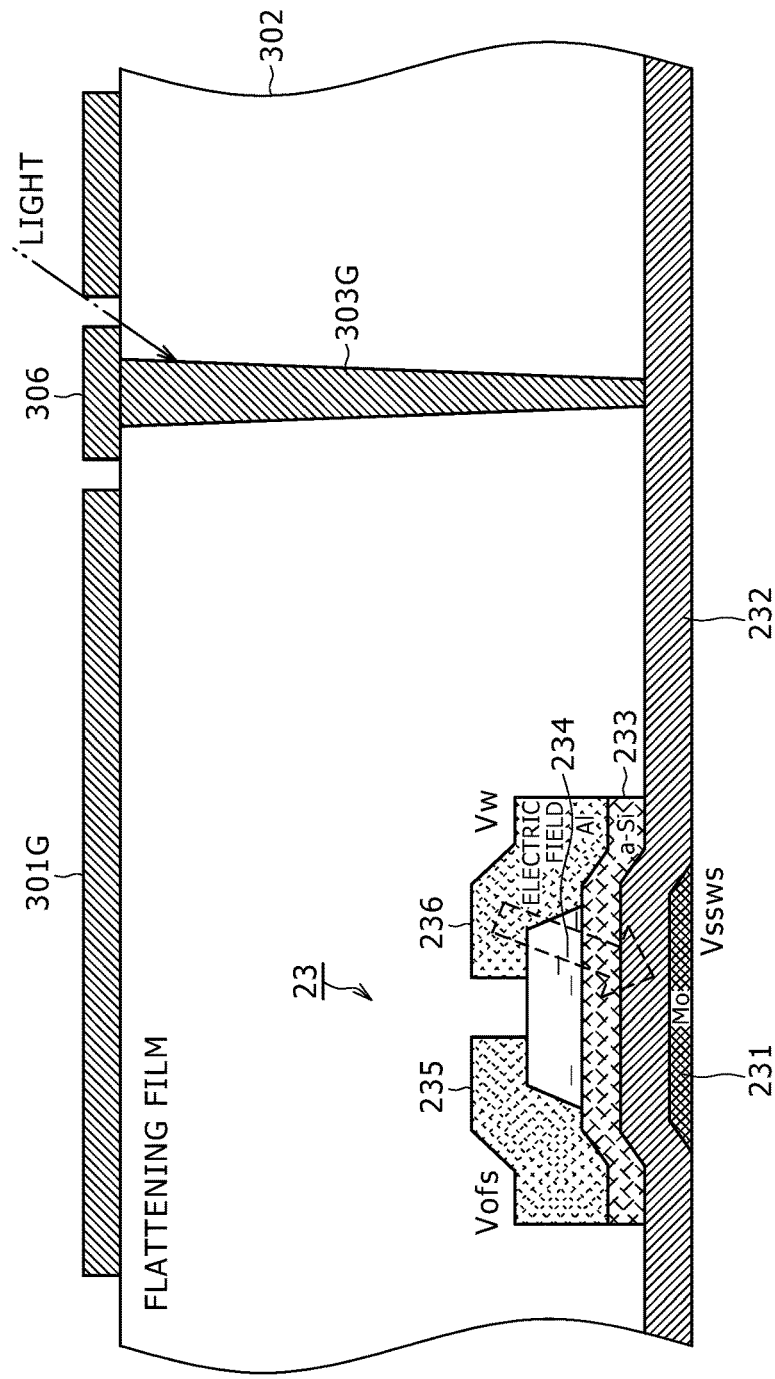
FIG. 20 is a sectional view showing a light blocking layout structure according to a working example 2.

FIG. 20 is a sectional view showing a light blocking layout structure according to a working example 2.

In the light blocking layout structure according to the working example 1, the light blocking member 303G is provided below the metal wiring layer 301G. In contrast, in the light blocking layout structure according to the present working example 2, the light blocking member 303G is provided below an auxiliary line 306 provided in the same layer as that of the metal wiring layer 301G between the pixels. Here, the auxiliary line 306 is normally disposed so as to surround each of the pixels in order to supply the cathode potential Vcath to the cathode electrode of the organic EL element 21.

For the light blocking member 303G, for example, a material same as that of the auxiliary line 306, that is, a metal material having high reflectivity such as aluminum, is used. While the light blocking member 303B for the B pixel is shown in FIG. 20, also the insulating films 303G-1 to 303G-4 in the modification 1 or the modification 2 to the working example 1 may be embedded at a lower end portion thereof in the gate insulating film 304. This similarly applies also to the B and R pixels 20B ad 20R.

In this manner, also where the light blocking member 303B is provided below the auxiliary line 306, it is possible to block blue light emitted from the B pixel 20B from being inputted to the R and G pixels 20R and 20B similarly as in the working example 1. In addition, the location below the auxiliary line 306 is outside the pixels, and there is an advantage that it is easier to produce the light blocking member 303G in regard to the space than where the auxiliary line 306 is provided below the metal wiring layer 301G and a large aperture can be formed.

2. Modifications

In the embodiment described above, the driving circuit for the organic EL element 21 basically has a 2-Tr configuration which includes two transistors (Tr) including the driving transistor 22 and the writing transistor 23, the present invention is not limited to the 2-Tr configuration. In particular, the driving circuit can have various pixel configurations such as, a pixel configuration which includes a transistor for controlling light emission/no-light emission of the organic EL element 21 in addition to the two transistors and another pixel configuration which additionally includes a switching transistor for selectively writing the reference voltage Vofs into the gate electrode of the driving transistor 22.

Further, while, in the embodiment described above, the present invention is applied to an organic EL display apparatus which uses an organic EL element as an electro-optical element of a pixel, the present invention is not limited to this application. In particular, the present invention can be applied to various display apparatus which use an electro-optical element, that is, a light emitting element, of the current driven type whose emitted light luminance varies in response to the value of current flowing to the element such as an inorganic EL element, an LED element or a semiconductor laser element.

3. Applications

The display apparatus according to an embodiment of the present invention described above can be applied to a display apparatus for electronic apparatus in various fields wherein an image signal inputted to the electronic apparatus or an image signal produced in the electronic apparatus is displayed as an image.

With the display apparatus according to an embodiment of the present invention, it is possible to suppress a characteristic shift caused by an influence of irradiation of light having high energy upon the channel of a pixel transistor thereby to suppress reduction of current to flow to the organic EL element and appearance of a fault in picture quality such as stripes and luminance unevenness. Accordingly, by using the display apparatus according to an embodiment of the present invention as a display apparatus of electronic apparatus in various fields, enhancement of the display quality of the display apparatus of the electronic apparatus can be anticipated.

The display apparatus according an embodiment of the present invention may be of the module type having an enclosed configuration. The display apparatus of the module type corresponds, for example, to a display module wherein an opposing element of transparent glass or the like is adhered to a display array section. On the transparent opposing portion, a color filter, a protective film and so forth as well as the light blocking film described hereinabove may be provided. It is to be noted that the display module may include a circuit section for inputting and outputting signals and so forth from the outside to the pixel array section and vice versa, a flexible printed circuit board (FPC) and so forth.

In the following, particular examples of an electronic apparatus to which an embodiment of the present invention is applied are described. In particular, the present invention can be applied to such various electronic apparatus as shown in FIGS. 21 to 25A to 25G, for example, to a digital camera, a notebook type personal computer, a portable terminal apparatus such as a portable telephone set and a video camera.

Figure 21:
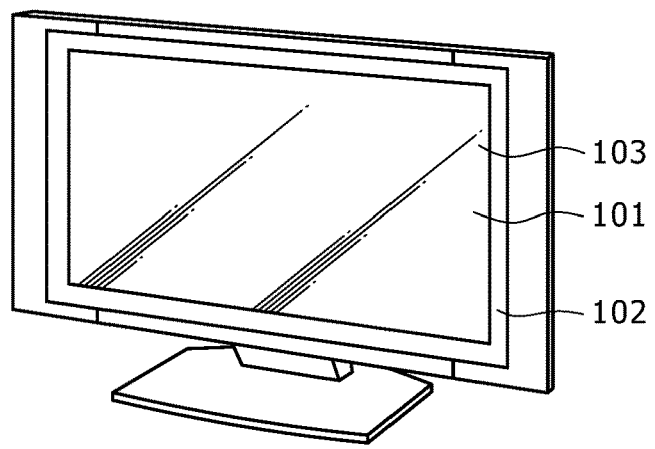
FIG. 21 is a perspective view showing an appearance of a television set to which an embodiment of the present invention is applied.

FIG. 21 shows an appearance of a television set to which an embodiment of the present invention is applied. Referring to FIG. 21, the television set shown includes a front panel 102 and an image display screen section 101 formed from a filter glass plate 103 and so forth and is produced using the display apparatus according to the embodiment of the present invention as the image display screen section 101.

Figure 22A:
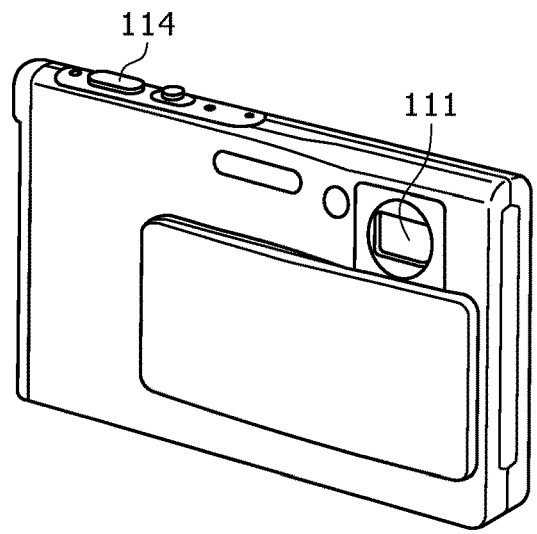
FIGS. 22A and 22B are perspective views showing an appearance of a digital camera to which an embodiment of the present invention is applied as viewed from the front side and the rear side, respectively.
Figure 22B:
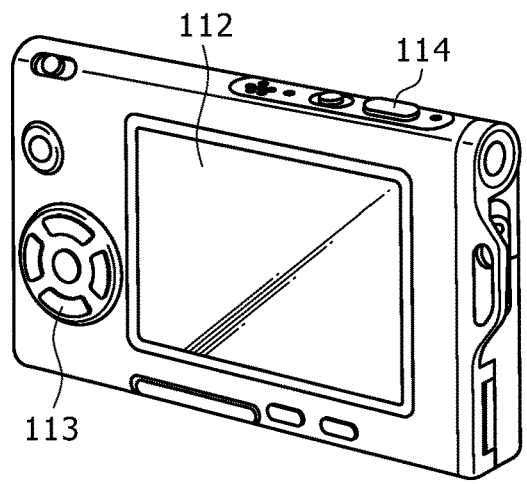

FIGS. 22A and 22B show an appearance of a digital camera to which an embodiment of the present invention is applied. Referring to FIGS. 22A and 22B, the digital camera shown includes a flash light emitting section 111, a display section 112, a menu switch 113, a shutter button 114 and so forth. The digital camera is produced using the display apparatus according to the embodiment of the present invention as the display section 112.

Figure 23:
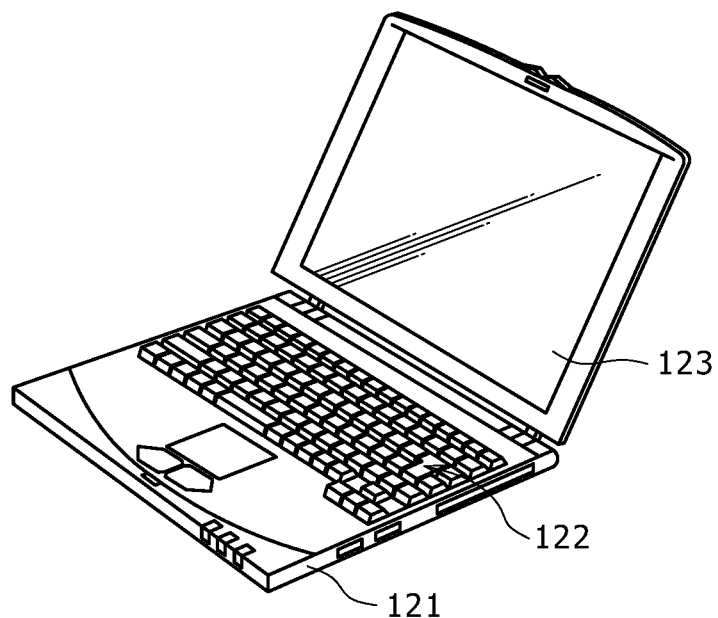
FIG. 23 is a perspective view showing an appearance of a notebook type personal computer to which an embodiment of the present invention is applied.

FIG. 23 shows an appearance of a notebook type personal computer to which an embodiment of the present invention is applied. Referring to FIG. 23, the notebook type personal computer shown includes a body 121, and a keyboard 122 for being operated in order to input characters and so forth, a display section 123 for displaying an image and so forth provided on the body 121. The notebook type personal computer is produced using the display apparatus according to the embodiment of the present invention as the display section 123.

Figure 24:
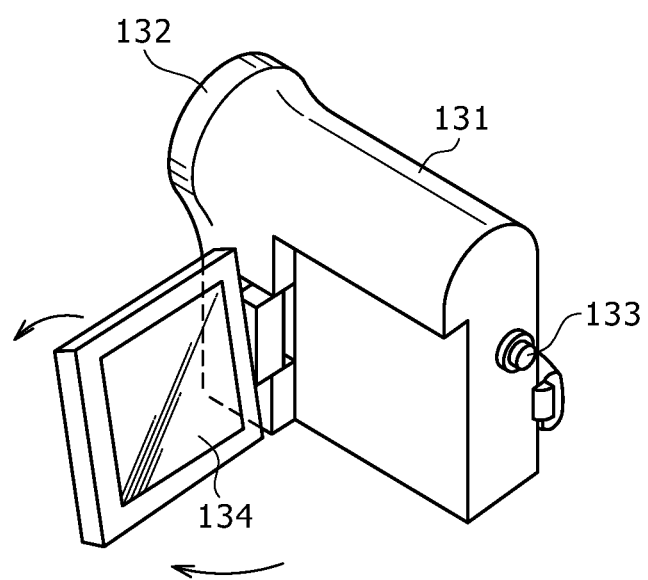
FIG. 24 is a perspective view showing an appearance of a video camera to which an embodiment of the present invention is applied.

FIG. 24 shows an appearance of a video camera to which an embodiment of the present invention is applied. Referring to FIG. 24, the video camera shown includes a body section 131, and a lens 132 for picking up an image of an image pickup object, a start/stop switch 133 for image pickup, a display section 134 and so forth provided on a face of the body section 131 which is directed forwardly. The video camera is produced using the display apparatus according to the embodiment of the present invention as the display section 134.

FIGS. 25A to 25G show an appearance of a portable terminal apparatus, for example, a portable telephone set, to which an embodiment of the present invention is applied. Referring to FIGS. 25A to 25G, the portable telephone set includes an upper side housing 141, a lower side housing 142, a connection section 143 in the form of a hinge section, a display section 144, a sub display section 145, a picture light 146, a camera 147 and so forth. The portable telephone set is produced using the display apparatus of the embodiment of the present invention as the display section 144 or the sub display section 145.

The present application contains subject matter related to that disclosed in Japanese Priority Patent Application JP 2008-325072 filed in the Japan Patent Office on Dec. 22, 2008, the entire content of which is hereby incorporated by reference.

It should be understood by those skilled in the art that various modifications, combinations, sub-combinations and alterations may occur depending on design requirements and other factor in so far as they are within the scope of the appended claims or the equivalents thereof.

What is claimed is:

1. A display apparatus, comprising:
   a plurality of subpixels arranged in a display region, the subpixels including:
      a first subpixel including a first light emitting element, and
      a second subpixel disposed adjacent the first subpixel and including a first transistor, a second transistor, a capacitor, a second light emitting element and a first wiring layer, and the first light emitting configured to emit light including blue light,
   wherein a light blocking member is disposed between the first transistor and the first light emitting element, and the light blocking member includes a light reflective material,
   the first wiring layer is disposed over the light blocking member and is in contact with the light blocking member,
   the first wiring layer is disposed at a same layer of the anode electrode of the second light emitting element,
   the first transistor includes a gate insulating film and a semiconductor layer, and
   a distance between a bottom surface of the light blocking member and a top surface of the substrate is smaller than a distance between a bottom surface of the semiconductor layer and the top surface of the substrate,
   the light blocking member is further configured such that either:
      (i) a width of the light blocking member is greater than a channel length of the first transistor, or
      (ii) the width of the light blocking member is greater than a channel width of the first transistor.

2. The display apparatus according to claim 1, wherein the light blocking member is disposed along an optical path between the first light emitting element and the first transistor.

3. The display apparatus according to claim 1, wherein the second light emitting element is configured to emit light including red light or green light.

4. The display apparatus according to claim 1, wherein the first transistor is a sampling transistor.

5. The display apparatus according to claim 1, wherein the second transistor is a driving transistor.

6. The display apparatus according to claim 1, wherein the light blocking member is configured to block the light emitted from the first light emitting element.

7. The display apparatus according to claim 1, wherein the light blocking member is configured to substantially block a light emitted from the first light emitting element.

8. The display apparatus according to claim 1, wherein the first transistor further comprises a gate electrode, and the gate insulating film is located between the gate electrode and the semiconductor layer.

9. The display apparatus according to claim 1, wherein the light blocking member is embedded in the gate insulating layer.

10. The display apparatus according to claim 1, wherein the light blocking member is a contact.

11. A display apparatus, comprising:
    a plurality of subpixels arranged in a display region, the subpixels including:
       a first subpixel including a first light emitting element, and
       a second subpixel disposed adjacent the first subpixel and including a first transistor, a second transistor, a capacitor, a second light emitting element and a first wiring layer, and the first light emitting configured to emit light including blue light,
    wherein a light blocking member is disposed between the first transistor and the first light emitting element, and the light blocking member includes a light reflective material,
    the first wiring layer is disposed over the light blocking member and is in contact with the light blocking member,
    the first wiring layer is disposed at a same layer of the anode electrode of the second light emitting element,
    the first transistor includes a gate insulating film and a semiconductor layer, and the light blocking member extends through the gate insulating film and the semiconductor layer
    the light blocking member is further configured such that either:
       (i) a width of the light blocking member is greater than a channel length of the first transistor, or
       (ii) the width of the light blocking member is greater than a channel width of the first transistor.

12. The display apparatus according to claim 1, wherein the light blocking member is configured to block the light emitted from the first light emitting element.

* * * * *